(12) United States Patent
Chen et al.

(10) Patent No.: US 12,009,386 B2
(45) Date of Patent: Jun. 11, 2024

(54) STRUCTURE AND METHOD FOR FORMING INTEGRATED HIGH DENSITY MIM CAPACITOR

(71) Applicant: Taiwan Semiconductor Manufacturing Co., Ltd., Hsinchu (TW)

(72) Inventors: Hsien-Wei Chen, Hsinchu (TW); Ying-Ju Chen, Tuku Township (TW); Jie Chen, New Taipei (TW); Ming-Fa Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 9 days.

(21) Appl. No.: 17/872,701

(22) Filed: Jul. 25, 2022

(65) Prior Publication Data

US 2022/0359642 A1    Nov. 10, 2022

Related U.S. Application Data

(62) Division of application No. 16/901,912, filed on Jun. 15, 2020, now Pat. No. 11,715,755.

(51) Int. Cl.
*H01L 23/522* (2006.01)
*H01G 4/30* (2006.01)
(Continued)

(52) U.S. Cl.
CPC .............. *H01L 28/60* (2013.01); *H01G 4/30* (2013.01); *H01L 21/76802* (2013.01);
(Continued)

(58) Field of Classification Search
CPC ............ H01L 23/5384; H01L 23/5386; H01L 21/76802; H01L 21/76879; H01L 23/5223; H01L 23/5226; H01L 23/5389
See application file for complete search history.

(56) References Cited

U.S. PATENT DOCUMENTS 6,225,207 B1   5/2001  Parikh
6,239,485 B1   5/2001  Peters et al.
(Continued)

FOREIGN PATENT DOCUMENTS

DE   112015007236 T5   10/2018
DE   102018122563 A1   4/2019
(Continued)

*Primary Examiner* — Bac H Au
(74) *Attorney, Agent, or Firm* — Slater Matsil, LLP

(57) ABSTRACT

Methods of forming a super high density metal-insulator-metal (SHDMIM) capacitor and semiconductor device are disclosed herein. A method includes depositing a first insulating layer over a semiconductor substrate and a series of conductive layers separated by a series of dielectric layers over the first insulating layer, the series of conductive layers including device electrodes and dummy metal plates. A first set of contact plugs through the series of conductive layers contacts one or more conductive layers of a first portion of the series of conductive layers. A second set of contact plugs through the series of dielectric layers avoids contact of a second portion of the series of conductive layers, the second portion of the series of conductive layers electrically floating.

20 Claims, 27 Drawing Sheets

(51) Int. Cl.
*H01L 21/768* (2006.01)
*H01L 49/02* (2006.01)

(52) U.S. Cl.
CPC .... *H01L 21/76877* (2013.01); *H01L 23/5223* (2013.01); *H01L 23/5226* (2013.01)

(56) References Cited

U.S. PATENT DOCUMENTS

| | | | |
|---|---|---|---|
| 6,335,494 | B1 | 1/2002 | Gregor et al. |
| 7,535,107 | B2 | 5/2009 | Salmon |
| 8,154,128 | B2 | 4/2012 | Lung |
| 8,164,171 | B2 | 4/2012 | Lin et al. |
| 8,211,791 | B2 | 7/2012 | Lin et al. |
| 8,383,512 | B2 | 2/2013 | Chen et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,431,347 | B2 | 8/2016 | Kunieda et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,524,933 | B2 | 12/2016 | Zhang et al. |
| 9,620,582 | B2 | 4/2017 | Hsieh et al. |
| 9,666,502 | B2 | 5/2017 | Chen et al. |
| 9,735,131 | B2 | 8/2017 | Su et al. |
| 10,790,233 | B2 | 9/2020 | May et al. |
| 10,796,990 | B2 | 10/2020 | Chen et al. |
| 10,867,968 | B2 | 12/2020 | Chen et al. |
| 10,878,162 | B2 | 12/2020 | Peng et al. |
| 10,985,169 | B2 | 4/2021 | Kai et al. |
| 11,121,086 | B2 | 9/2021 | Hiblot et al. |
| 11,158,580 | B2 | 10/2021 | Sio et al. |
| 11,223,786 | B2 | 1/2022 | Sato et al. |
| 11,264,314 | B2 | 3/2022 | Miyazawa et al. |
| 2004/0238942 | A1 | 12/2004 | Chakravorty et al. |
| 2006/0033138 | A1 | 2/2006 | Fukada |
| 2006/0103024 | A1 | 5/2006 | Salmon |
| 2010/0103634 | A1 | 4/2010 | Funaya et al. |
| 2010/0027067 | A1 | 10/2010 | Holesovsky et al. |
| 2010/0270671 | A1 | 10/2010 | Holesovsky et al. |
| 2011/0089569 | A1 | 4/2011 | Asakawa |
| 2012/0181701 | A1 | 7/2012 | Chen et al. |
| 2014/0360759 | A1 | 12/2014 | Kunieda et al. |
| 2016/0093591 | A1 | 3/2016 | Lan et al. |
| 2016/0118338 | A1 | 4/2016 | Zhang et al. |
| 2017/0186715 | A1 | 6/2017 | Yu et al. |
| 2019/0051607 | A1 | 2/2019 | Suk et al. |
| 2019/0103352 | A1 | 4/2019 | Chou |
| 2019/0103353 | A1 | 4/2019 | Liu et al. |
| 2019/0139915 | A1 | 5/2019 | Dalmia et al. |
| 2019/0148342 | A1* | 5/2019 | Hu .................. H01L 25/105 257/659 |
| 2019/0157210 | A1 | 5/2019 | May et al. |
| 2019/0166319 | A1 | 5/2019 | Sato et al. |
| 2019/0305078 | A1 | 10/2019 | Wu et al. |
| 2020/0006183 | A1 | 1/2020 | Huang et al. |
| 2020/0066641 | A1 | 2/2020 | Aygun et al. |
| 2020/0091063 | A1 | 3/2020 | Chen et al. |
| 2020/0152608 | A1 | 5/2020 | Hu et al. |
| 2020/0203276 | A1 | 6/2020 | Hiblot et al. |
| 2020/0205279 | A1 | 6/2020 | Ecton et al. |
| 2020/0286905 | A1 | 9/2020 | Kai et al. |
| 2021/0098349 | A1 | 4/2021 | Miyazawa et al. |
| 2021/0098558 | A1 | 4/2021 | Chen et al. |
| 2021/0118805 | A1 | 4/2021 | Sio et al. |
| 2021/0249262 | A1 | 8/2021 | Peng et al. |
| 2021/0280491 | A1 | 9/2021 | Lin et al. |
| 2021/0343650 | A1 | 11/2021 | Peng et al. |
| 2021/0407942 | A1 | 12/2021 | Yu et al. |

FOREIGN PATENT DOCUMENTS

| | | |
|---|---|---|
| JP | 2003007850 A | 1/2003 |
| JP | 2006054333 A | 2/2006 |
| KR | 20160092463 A | 8/2016 |
| KR | 20190024628 A | 3/2019 |

* cited by examiner

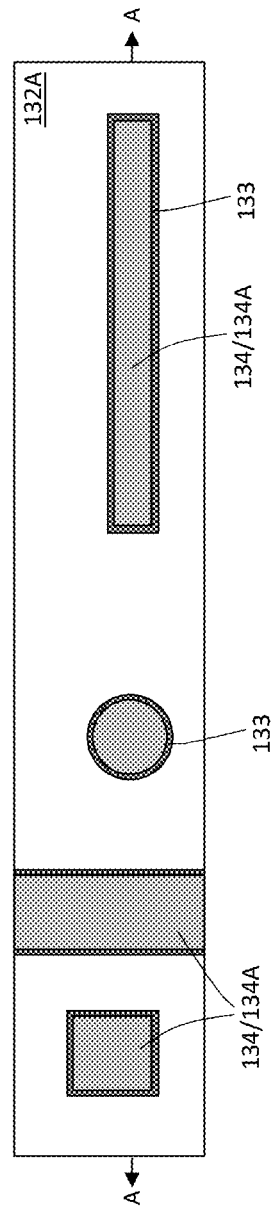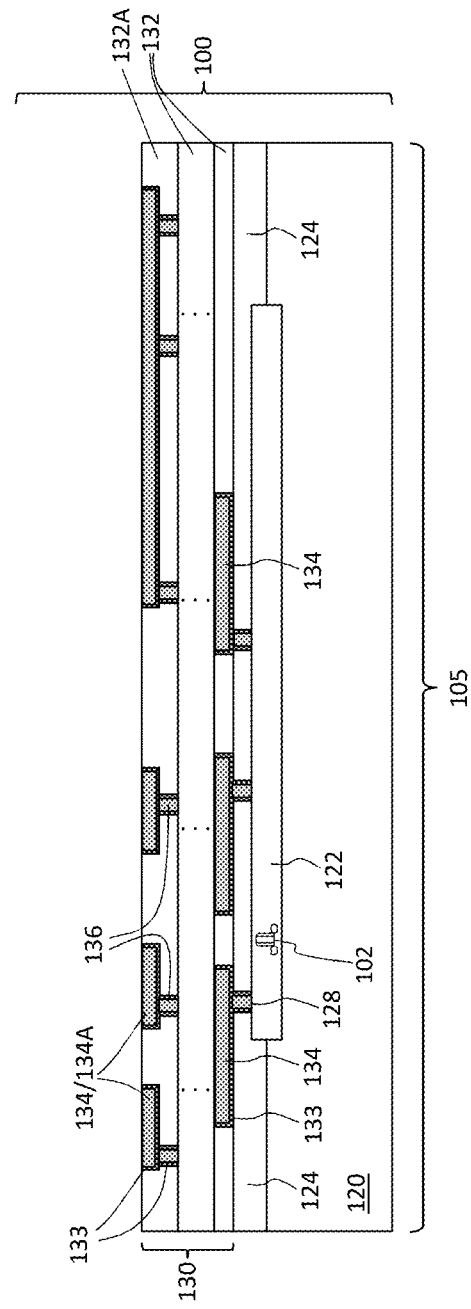
Fig. 3B
Fig. 3A

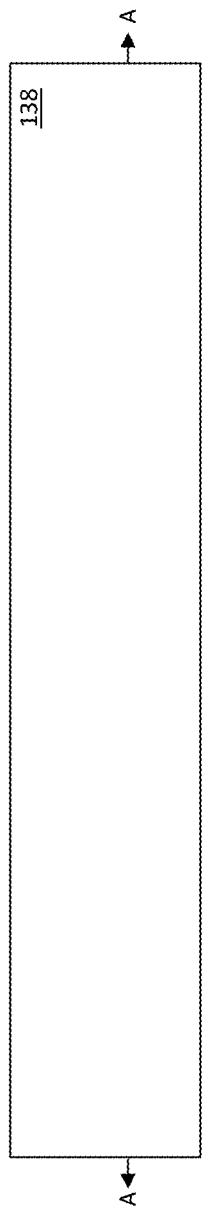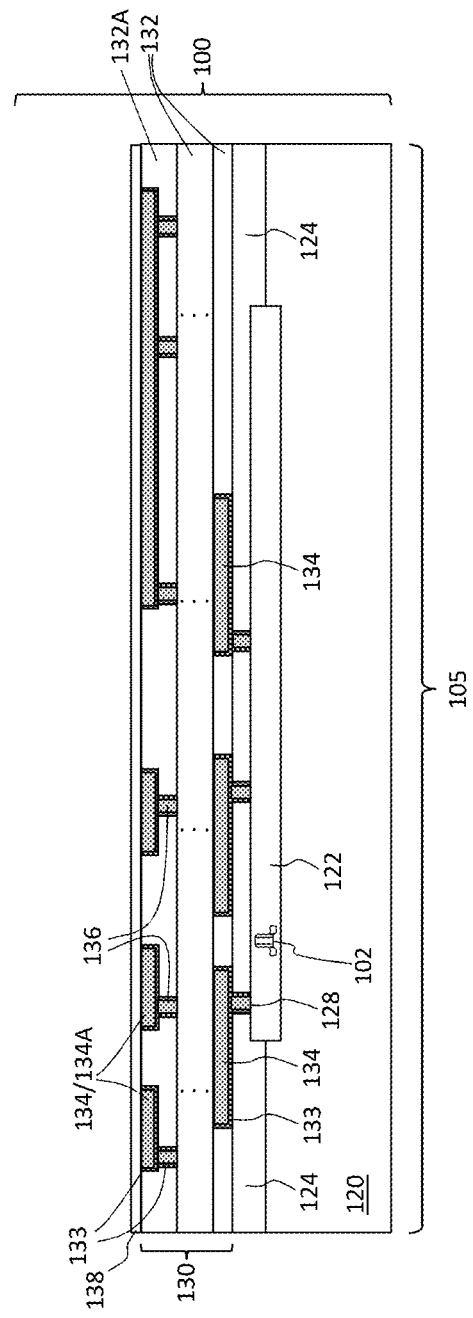
Fig. 4B
Fig. 4A

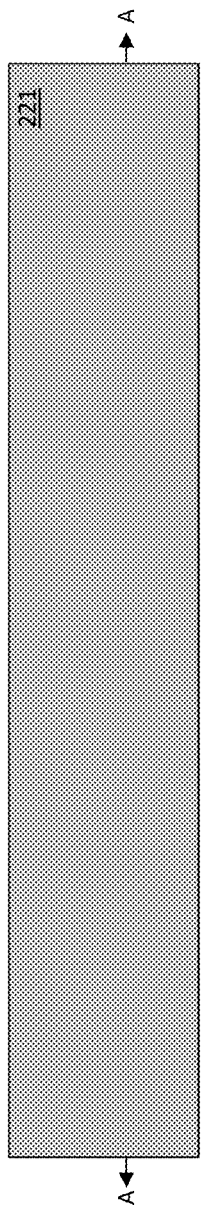
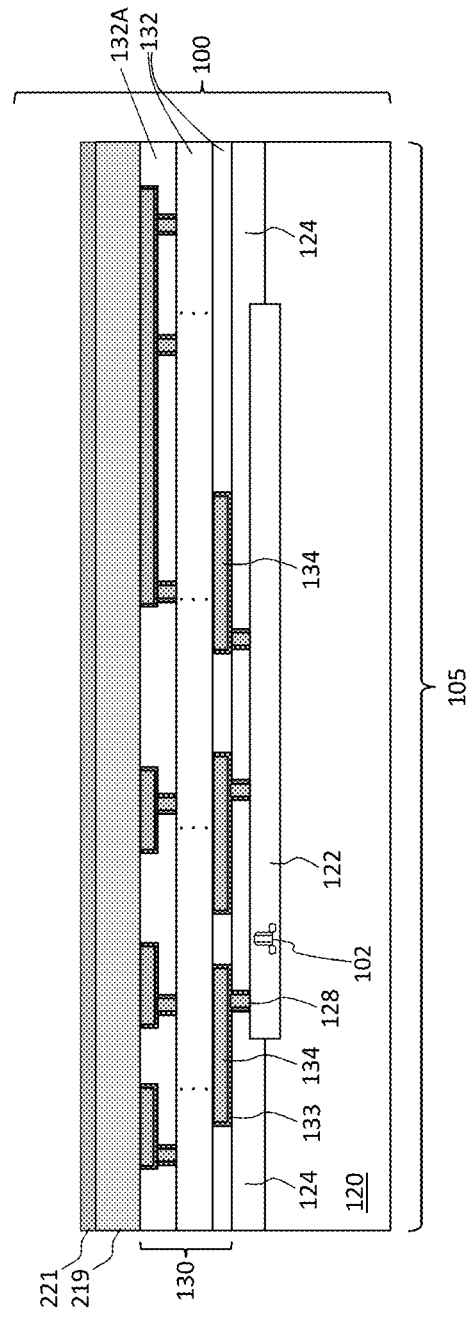
Fig. 6B
Fig. 6A

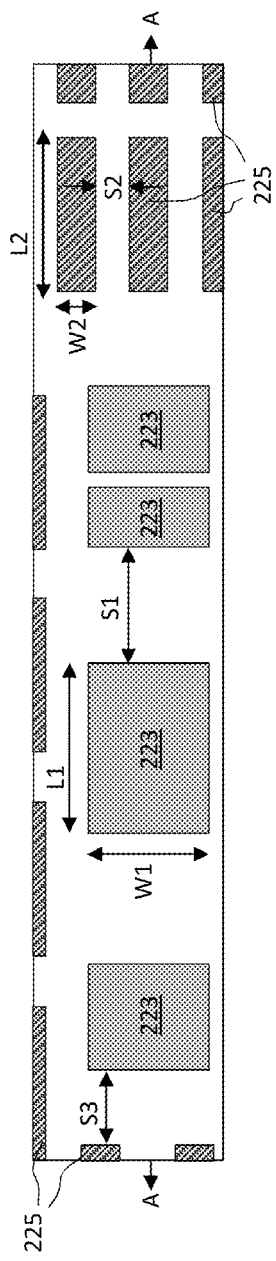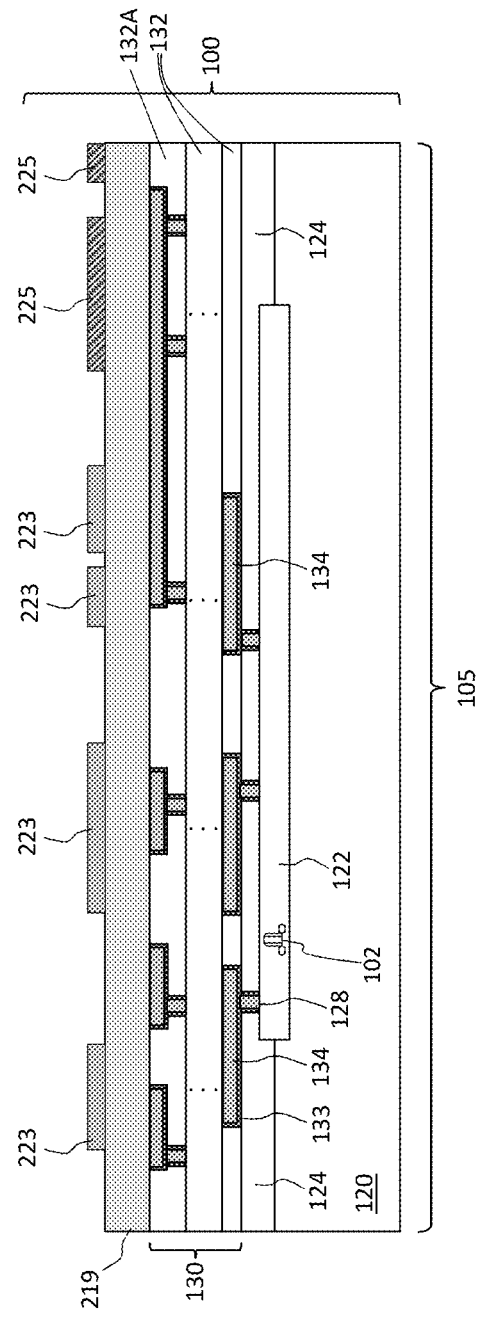

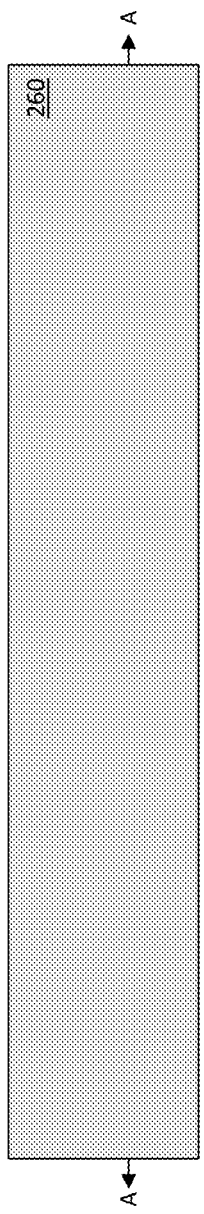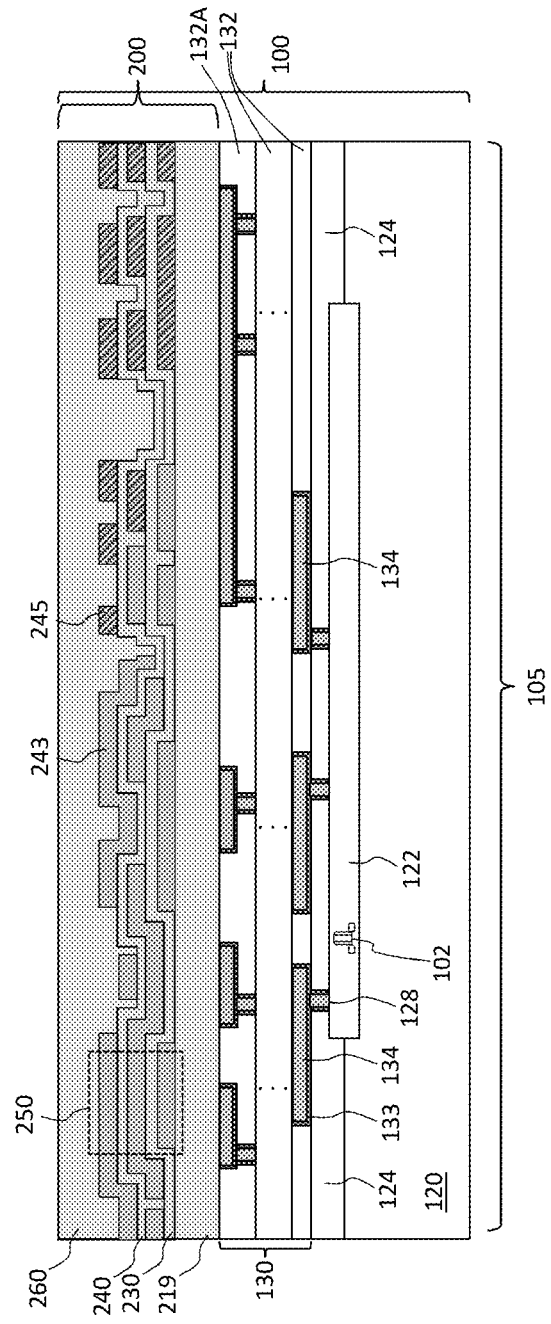
Fig. 12B
Fig. 12A

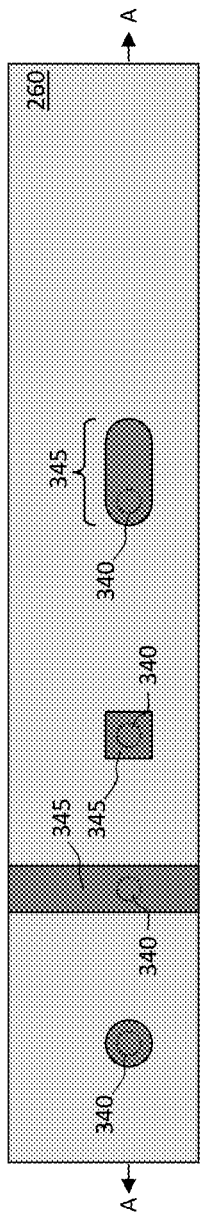
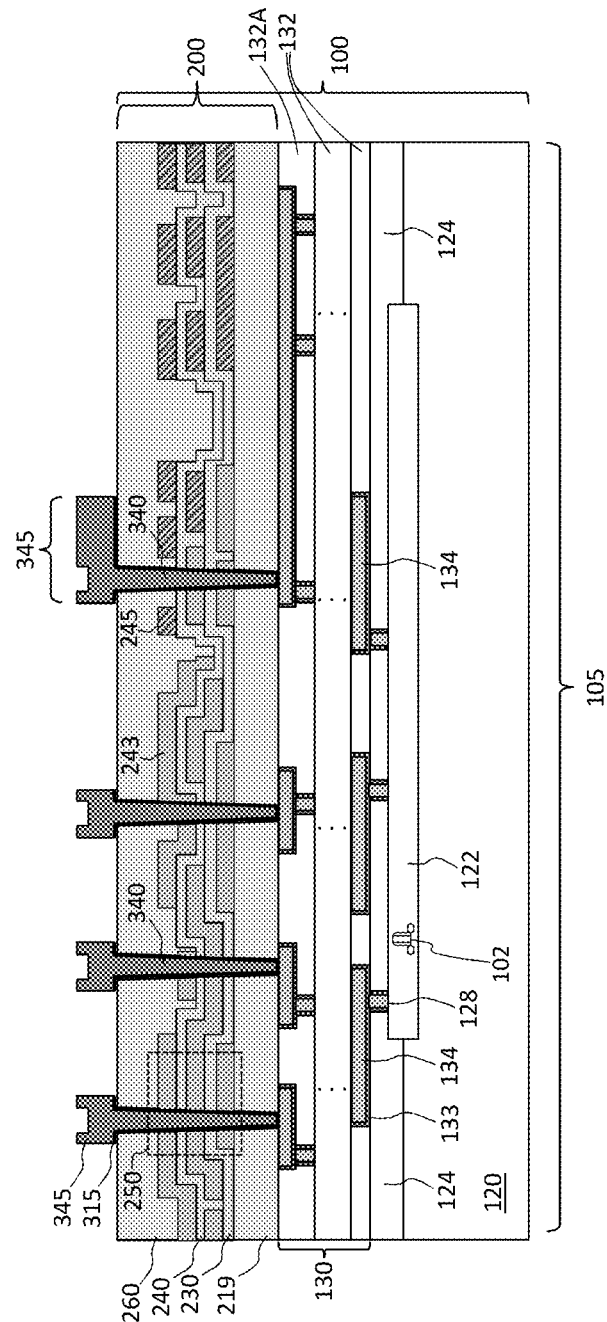
Fig. 16B
Fig. 16A

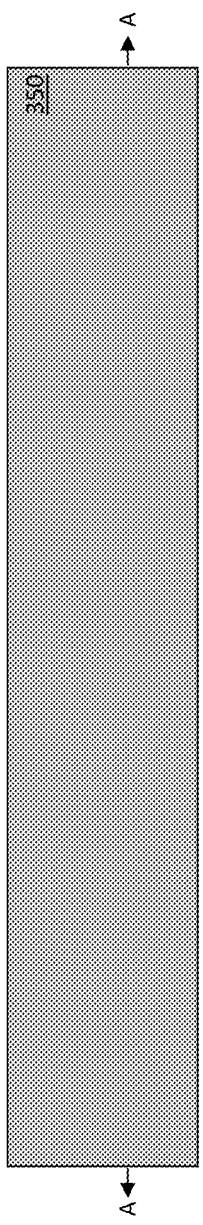
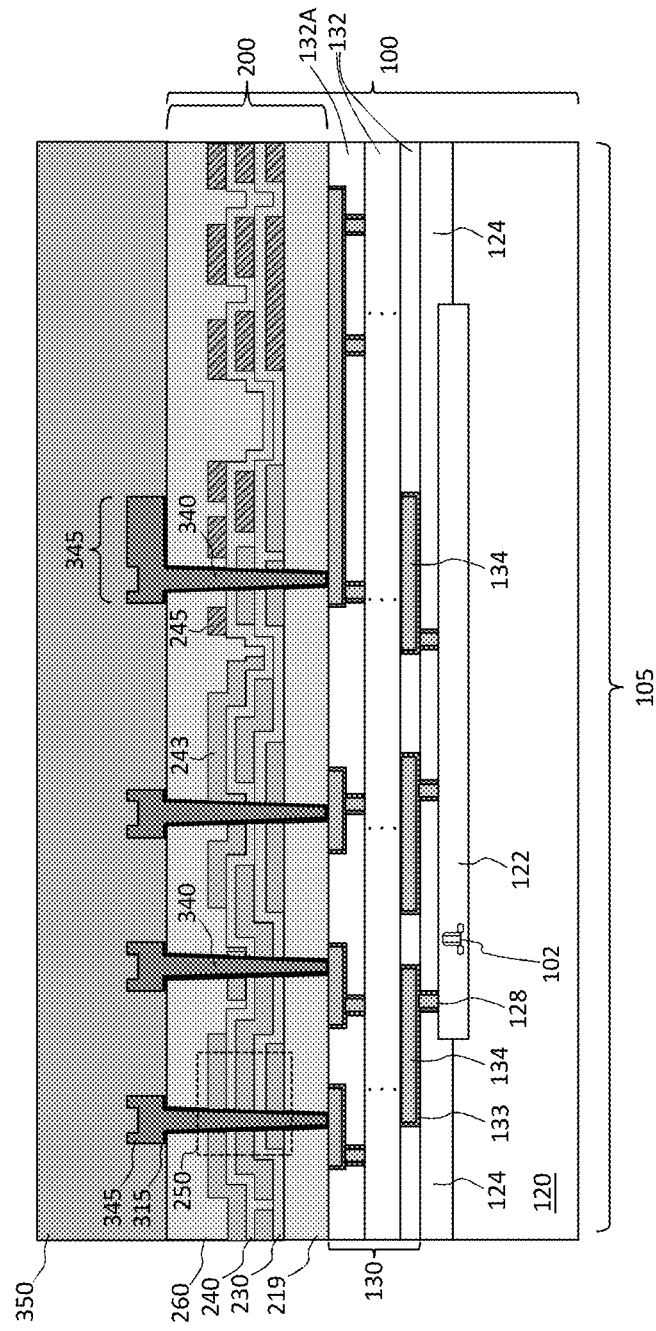
Fig. 17B
Fig. 17A

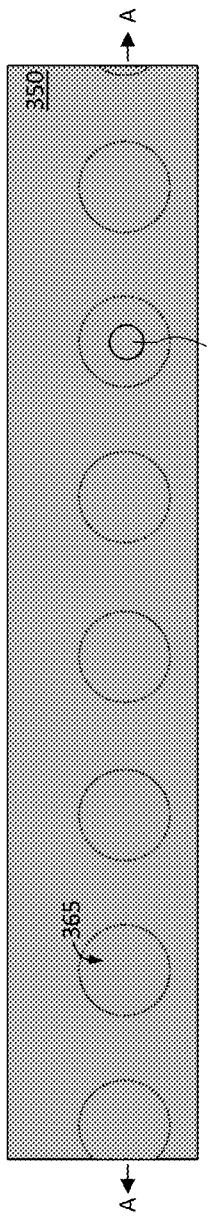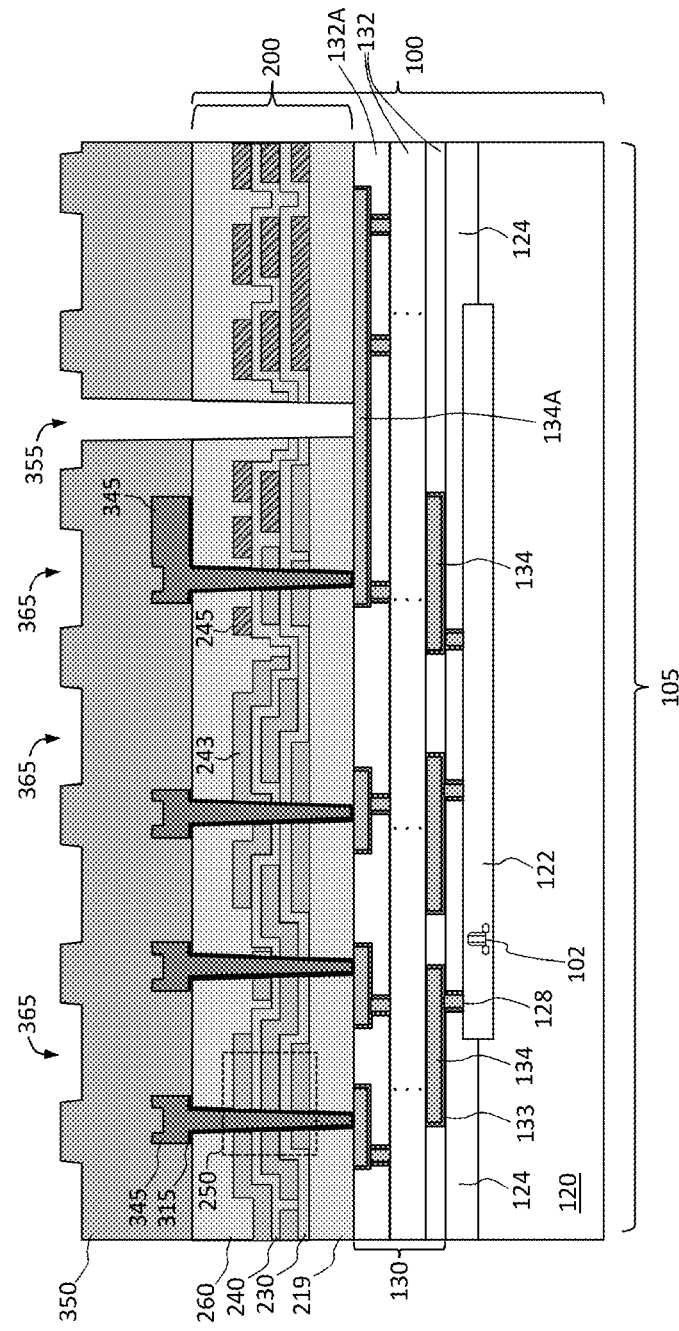

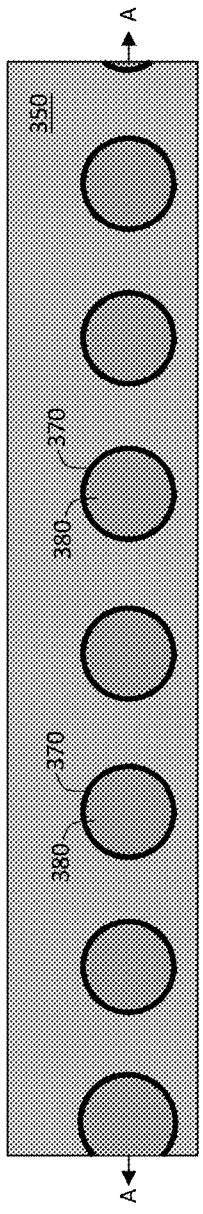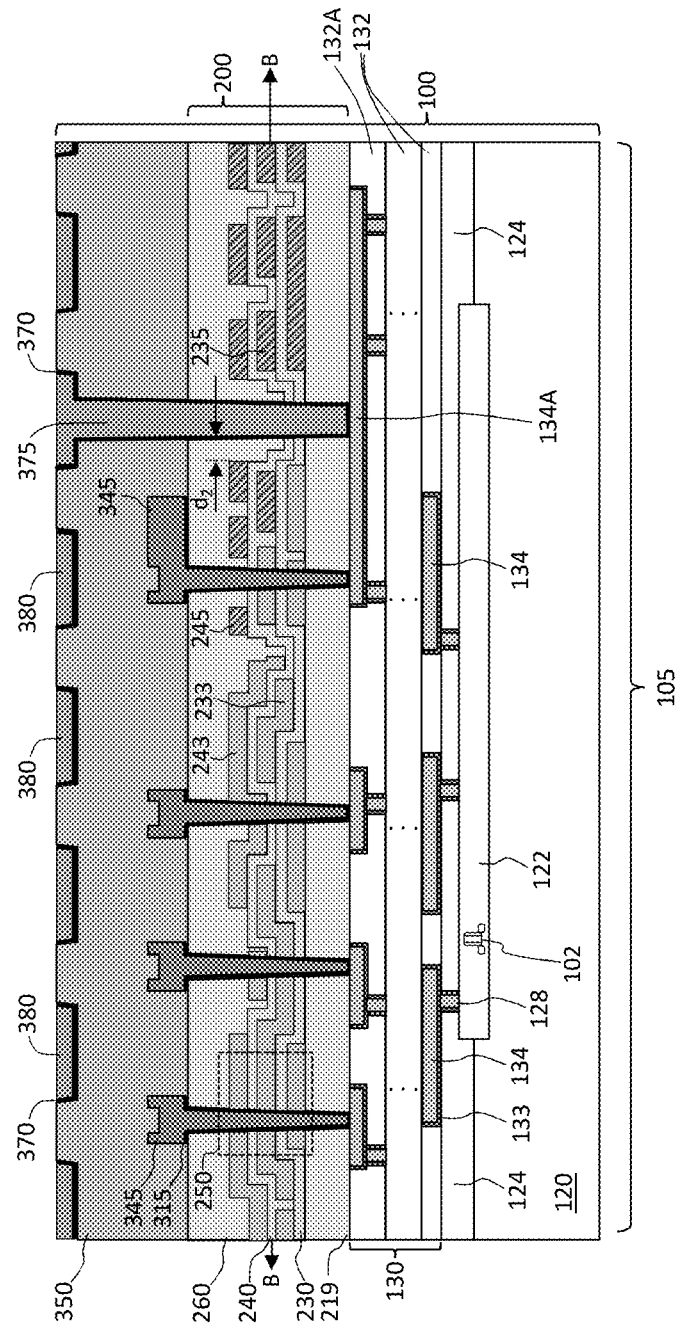

STRUCTURE AND METHOD FOR FORMING INTEGRATED HIGH DENSITY MIM CAPACITOR

PRIORITY CLAIM AND CROSS-REFERENCE

This patent is a divisional of U.S. application Ser. No. 16/901,912, filed on Jun. 15, 2020, which application is hereby incorporated by reference herein as if reproduced in its entirety.

BACKGROUND

Metal-Insulator-Metal (MIM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, decoupling capacitors are also used in power supplies, so that the power supplies may accommodate the variations in current-draw, so that the variation in power supply voltage is minimized. When the current-draw in a device changes, the power supply itself cannot respond to the change instantaneously. The decoupling capacitors thus may act as power storages to maintain power supply voltages in response to the current-draw.

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B through FIGS. 20A and 20B illustrate intermediate views in the formation of a package device, in accordance with some embodiments

DETAILED DESCRIPTION

Figure 1:
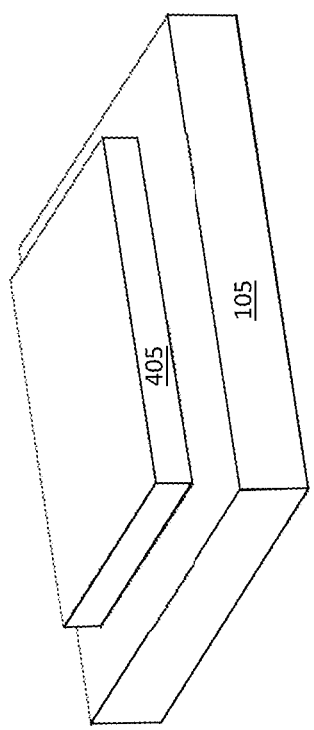
FIG. 1 illustrates a perspective view of two package components that are coupled together, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor die/wafer including a capacitor and the method of forming the same are provided in accordance with some embodiments. The intermediate stages of forming the capacitor are illustrated. The variations of the embodiments are discussed. Throughout the various views and illustrative embodiments, like reference numbers are used to designate like elements.

Methods of forming a super high density metal-insulator-metal (MIM) (MIM-SHD or SHDMIM) capacitor and semiconductor device are disclosed herein. When a SHDMIM is formed in some areas of a device die, but not in other areas of the device die, when a capping layer is formed, the capping layer may not have a level upper surface. As a result, subsequently formed through vias and landings may be formed having upper surfaces which are not level. This unevenness may further propagate into the dielectric bonding layer and cause bond failure due to a non-planar bonding surface. Embodiments advantageously include dummy metal plates as needed to pad the SHDMIM layers to prevent unevenness in the capping layer. The process for forming the dummy metal plates includes depositing a series of metal layers and alternating dielectric layers for the SHDMIM devices, while after each metal layer, patterning first metal layer into metallizations for the SHDMIM devices and metallizations for the dummy metal plates. The dummy metal plates may be patterned to include a keep-out-zone (KOZ) for subsequently formed landing pad vias and/or bond pad vias. Other landing pad vias and/or bond pad vias formed through the SHDMIM devices couple the metal layers of the SHDMIM devices to one or more active devices of the semiconductor substrate.

FIG. 1 illustrates a perspective view of an SoIC package device in an intermediate step in accordance with some embodiments. The device die 105 may be a logic die, such as a Central Processing Unit (CPU) die, a Micro Control Unit (MCU) die, an input-output (IO) die, a BaseBand (BB) die, an Application processor (AP) die, or the like. The device die 105 may also be a memory die such as a Dynamic Random Access Memory (DRAM) die or a Static Random Access Memory (SRAM) die, or the like. The device die 105 may be part of a wafer (see FIG. 2). The device die 405 is electrically bonded to the device die 105. The device die 405 may be a logic die, which may be a CPU die, MCU die, IO die, Base-Band die, or AP die. The device die 405 may also be a memory die. Multiple ones of the device dies 405 may be bonded to the device die 105, each one having different functionality.

Figure 2:
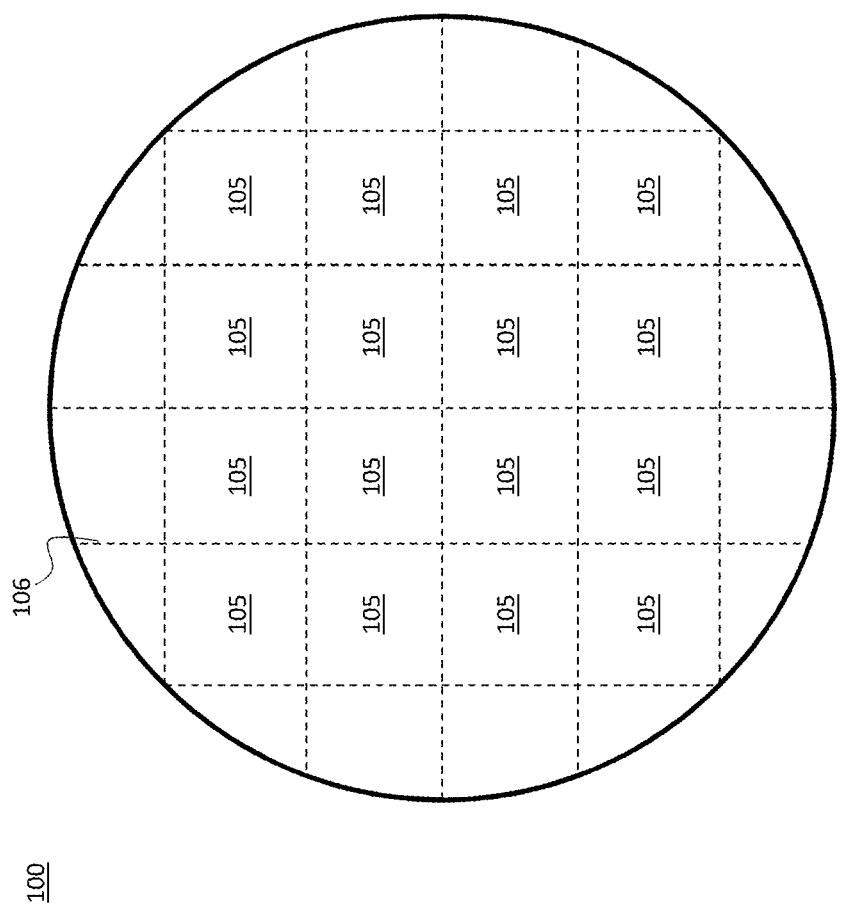
FIG. 2 illustrates a top down view of a wafer, in accordance with some embodiments.

FIG. 2 illustrates a package component 100 (which may be a wafer, as illustrated) with multiple device dies 105 defined within. The device dies 105 may all be of the same design and function or may be of different designs and functions. The dashed lines represent dicing lines 106 where the device dies 105 will be separated from each other in a subsequent singulation process.

FIGS. 3A and 3B through FIGS. 20A and 20B illustrate cross-sectional views of intermediate stages in the formation of a package device, such as an SoIC package, in accordance with some embodiments of the present disclosure. FIG. 3A illustrates the cross-sectional view in the formation of package component 100. FIG. 3B illustrates a top-down view (or plan view) in the formation of package component 100. The view of FIG. 3A is a cross-sectional view along the line A-A of FIG. 3B. In accordance with some embodiments of the present disclosure, package component 100 is a portion of a device wafer including integrated circuit devices 122, e.g., active devices 102 such as transistors and/or diodes, and possibly passive devices such as capacitors, inductors, resistors, or the like. The active devices 102 are represented by a single transistor. However, as one of skill in the art will recognize, a wide variety of active devices may be used to generate the desired structural and functional requirements of the design for the semiconductor device. The active devices 102 may be formed using any suitable methods either within or else on the surface of the semiconductor substrate 120. Package component 100 may include a plurality of device dies 105 therein, with a portion of device die 105 illustrated. It should be understood that these views are merely illustrative and not limiting. Illustrated features may not be shown to scale so as to enhance details or simplify details as needed.

In accordance with other embodiments of the present disclosure, package component 100 includes passive devices (with no active devices). In some embodiments, and as referenced in the discussion below, package component 100 may be a device wafer. The embodiments of the present disclosure may also be applied to other types of package components such as interposer wafers.

In accordance with some embodiments of the present disclosure, the wafer 100 includes semiconductor substrate 120 and the features formed at a top surface of semiconductor substrate 120. Semiconductor substrate 120 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 120 may also be a bulk silicon substrate or a Silicon-On-Insulator (SOI) substrate. Shallow Trench Isolation (STI) regions (not shown) may be formed in semiconductor substrate 120 to isolate the active regions in semiconductor substrate 120. Although not shown, through-vias may be formed to extend into semiconductor substrate 120, and the through-vias are used to electrically inter-couple the features on opposite sides of wafer 100.

In accordance with some embodiments of the present disclosure, wafer 100 includes integrated circuit devices 122, which are formed on the top surface of semiconductor substrate 120. Example integrated circuit devices 122 may include Complementary Metal-Oxide Semiconductor (CMOS) transistors, resistors, capacitors, diodes, and/or the like. The details of integrated circuit devices 122 are not illustrated herein. In accordance with other embodiments, wafer 100 is used for forming interposers, in which semiconductor substrate 120 may be a semiconductor substrate or a dielectric substrate.

Inter-Layer Dielectric (ILD) 124 is formed over semiconductor substrate 120, and fills the space between the gate stacks of transistors (not shown) in integrated circuit devices 122. In accordance with some embodiments, ILD 124 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS) formed silicon oxide, or the like. ILD 124 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 128 are formed in ILD 124, and are used to electrically connect integrated circuit devices 122 to overlying metal lines 134 and vias 136. In accordance with some embodiments of the present disclosure, contact plugs 128 are formed of a conductive material selected from tungsten, aluminum, copper, titanium, tantalum, titanium nitride, tantalum nitride, alloys therefore, and/or multi-layers thereof. The formation of contact plugs 128 may include forming contact openings in ILD 124, filling a conductive material(s) into the contact openings, and performing a planarization (such as Chemical Mechanical Polish (CMP) process) to level the top surfaces of contact plugs 128 with the top surface of ILD 124.

Over ILD 124 and contact plugs 128 resides interconnect structure 130. Interconnect structure 130 includes dielectric layers 132, and metal lines 134 and vias 136 formed in dielectric layers 132. Dielectric layers 132 are alternatively referred to as Inter-Metal Dielectric (IMD) layers 132 hereinafter. In accordance with some embodiments of the present disclosure, at least the lower ones of dielectric layers 132 are formed of a low-k dielectric material having a dielectric constant (k-value) lower than about 3.0 or about 2.5. Dielectric layers 132 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 132 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 132 includes depositing a porogen-containing dielectric material, and then performing a curing process to drive out the porogen, and hence the remaining dielectric layers 132 becomes porous. Etch stop layers (not shown), which may be formed of silicon carbide, silicon nitride, or the like, are formed between IMD layers 132, and are not shown for simplicity.

Metal lines 134 and vias 136 are formed in dielectric layers 132. The metal lines 134 at a same level are collectively referred to as a metal layer hereinafter. In accordance with some embodiments of the present disclosure, interconnect structure 130 includes a plurality of metal layers that are interconnected through vias 136. Metal lines 134 and vias 136 may be formed of copper or copper alloys, and they can also be formed of other metals. The formation process may include single damascene and dual damascene processes. In a single damascene process, a trench is first formed in one of dielectric layers 132, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively.

The conductive material may include a diffusion barrier (e.g. diffusion barrier layer 133) and a copper-containing metallic material over the diffusion barrier. The diffusion barrier layers 133 are formed in the dielectric layer 132 during, e.g., the damascene or dual damascene process used to form the metal lines 134 within the dielectric layer 132. For example, during a damascene process, trenches are formed in the dielectric layer 132 to a desired depth and shape of the conductive features to be formed therein. As such, a surface of the dielectric layer 132 becomes contoured by the profile of the trenches formed within the dielectric layer 132. Once the openings are formed, a diffusion barrier material is deposited over and conforms to the contoured surface of the dielectric layer 132. In some embodiments, the material of the diffusion barrier layers 133 may include titanium (Ti), titanium nitride (TiN), tantalum (Ta), tantalum nitride (TaN), or the like and the diffusion barrier layers 133 may be formed to a thickness of between about 50 Å and about 100 Å. However, any suitable material and any suitable thickness may be used for the diffusion barrier layers 133.

Once the diffusion barrier layers 133 have been deposited, a conductive fill material (e.g., copper (Cu)) is deposited over the diffusion barrier layers 133 and, in some embodiments, the conductive fill material may be deposited such that remaining portions of the trenches are overfilled to a level above the planar surface of the dielectric layer 132. Once deposited, a planarization process (e.g., chemical mechanical polishing (CMP)) may be performed to remove excess portions of the diffusion barrier layer 133 and excess portions of the conductive fill material extending over the planar surface of the dielectric layer 132. As such, the metal lines 134 including the diffusion barrier layers 133 are formed within the dielectric layers 132 of the interconnect structure 130, as illustrated in FIG. 3. The diffusion barrier layers 133 have the function of preventing the conductive material (e.g., copper (Cu)) of the metal lines 134 from diffusing into the dielectric layer 132. In some embodiments, the metal lines 134 may be formed to a thickness between about 5,000 Å and about 20,000 Å. However, any suitable material and any suitable thickness may be used for the metal lines 134.

The metal lines 134 include the metal lines 134A, which may be referred to as the top metal lines. The top metal lines 134A are also collectively referred to as being a top metal layer. The respective top dielectric layer 132A may be formed of a non-low-k dielectric material such as Un-doped Silicate Glass (USG), silicon oxide, silicon nitride, or the like. The top dielectric layer 132A may also be formed of a low-k dielectric material, which may be selected from the similar materials of the underlying IMD layers 132.

In FIGS. 4A and 4B, an optional etch stop layer 138 may be formed over the interconnect structure 130, in accordance with some embodiments. In such embodiments, the etch stop layer 138 may be formed as a blanket layer of dielectric material over the top layer of the interconnect structure 130, thereby isolating the metal lines 134 from any subsequently formed layer. The etch stop layer 138 may be deposited using plasma enhance chemical vapor deposition (PECVD), low-pressure chemical vapor deposition (LPCVD), atomic layer deposition (ALD), or the like. However, any suitable material and process may be utilized to form the etch stop layer 138. In accordance with some embodiments, the etch stop layer 138 includes a layer of silicon nitride (SiN) to a thickness between about 500 Å and about 1000 Å. However, any suitable material and any suitable thickness may be used for the etch stop layer 138. The etch stop layer 138 is omitted from view in subsequent figures for simplicity.

Figure 5B:
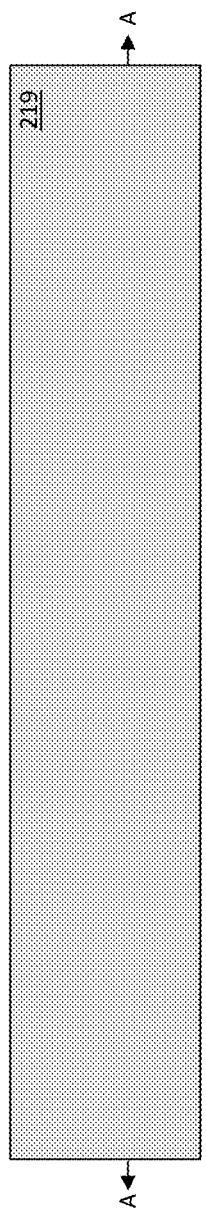
Figure 5A:
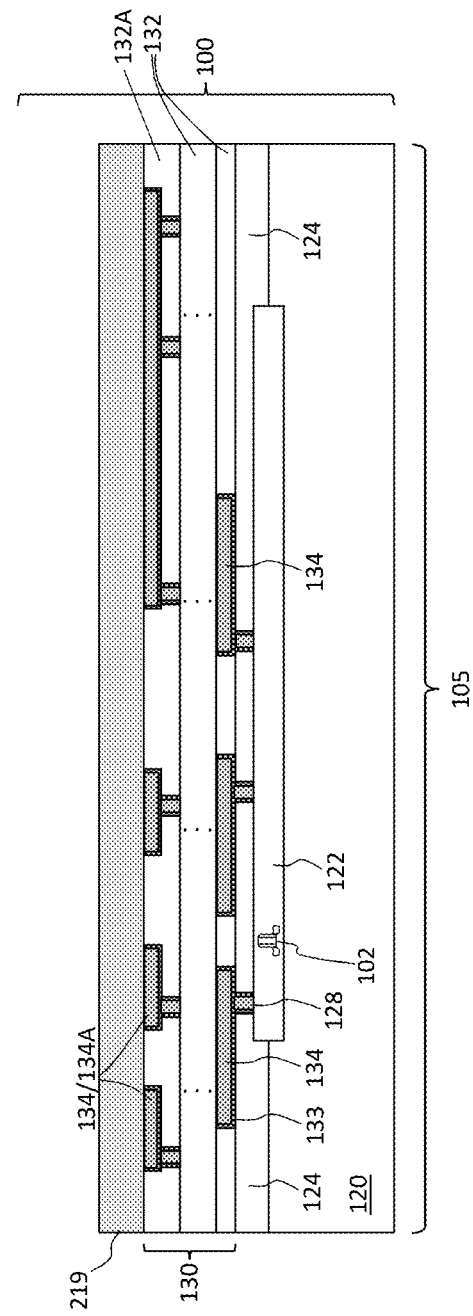

FIGS. 5A and 5B through FIGS. 12A and 12B illustrate intermediate steps in the formation of a passivation structure (e.g., passivation structure 200 of FIG. 12A) that has SHD-MIM devices formed therein. In FIGS. 5A and 5B, an insulating layer 219 may be formed over the interconnect structure 130 (or the optional etch stop layer 138 of FIG. 4A). In some embodiments, the insulating layer 219 may be formed as a plasma enhanced oxide undoped silicon glass (PEOX-USG) to a thickness between about 2000 Å and about 3000 Å. In some embodiments, the insulating layer 219 is a tetraethyl orthosilicate (TEOS) formed layer of silicon oxide. The insulating layer 219 may be formed as a blanket layer using Plasma Enhance Chemical Vapor Deposition (PECVD), Low-Pressure Chemical Vapor Deposition (LPCVD), Atomic Layer Deposition (ALD), or the like. However, any suitable material, any suitable thickness, and any suitable process may be utilized to form the insulating layer 219.

In FIGS. 6A and 6B, a bottom electrode layer 221 is formed as a blanket metal layer over the insulating layer 219. In accordance with some embodiments, the bottom electrode layer 221 is deposited by a technique including one of a chemical vapor deposition (CVD) and an atomic layer deposition (ALD). However, any suitable technique may be used to form the bottom electrode layer 221. According to some embodiments, the bottom electrode layer 221 is formed of a metal nitride such as titanium nitride (TiN), and is formed to a thickness between about 400 Å and about 600 Å. However, any suitable material and any suitable thickness may be used to form the bottom electrode layer 221.

Referring to FIGS. 7A and 7B, in some embodiments, an etching process may follow the formation of the bottom electrode layer 221 to remove an undesired portion of the bottom electrode layer 221, thereby forming bottom electrodes 223 and the dummy metal plates 225 (which may also be referred to as the bottom dummy metal plates 225). For example, a photo resist layer may be deposited as a blanket layer over the bottom electrode layer 221. Once deposited, the photo resist layer may be patterned to expose a portion of the bottom electrode layer 221 to be removed. The exposed portion of the bottom electrode layer 221 is removed by a suitable etching process (e.g., a wet or dry etch using, in some embodiments, a second process gas comprising hydrofluoric acid (HF)). However, any suitable etching process may be used and any suitable etchant may be used to remove undesired portions of the of the bottom electrode layer 221. Depending on the etching process used to remove the exposed portion of the bottom electrode layer 221, all, some or none of the photo resist layer may be consumed during etching. Any remaining material of the photo resist layer may be removed from the remaining portion of the bottom electrode layer 221, for example, by an ashing process. However, any suitable process may be used to remove the remaining material of the photo resist layer.

In some embodiments, the bottom electrodes 223 may be etched to each have an overall length L1 of between about 10 μm and about 250 μm and an overall width W1 of between about 10 μm and about 250 μm. Each of the bottom electrodes 223 will have a length L1 and width W1 based on the functional design of the respective MIM devices. As such, any suitable length and width may be used for each of the bottom electrodes 223.

The dummy metal plates 225 may be etched to each have an overall length L2 of between about 10 μm and about 250 μm and an overall width W2 of between about 10 μm and about 250 μm. Because they are non-functional, the dummy metal plates 225 may each be sized to be about the same size, with the exception that some of the dummy metal plates 225 may be etched or positioned to avoid subsequently formed bond pad vias (e.g., bond pad vias 380 of FIGS. 20A and 20B) and/or landing pad vias (e.g., landing pad vias 345 of FIGS. 16A and 16B) by avoiding a keep-out-zone (e.g., KOZ 310 of FIGS. 13A and 13B, or KOZ 360 of FIGS. 21A through 21D) disposed around each of the landing pad vias and/or bond pad vias.

The spacing S1 between each of the bottom electrodes 223 may be between about 0.5 μm and about 2 μm. Similarly, the spacing S2 between each of the dummy metal plates 225 may be between about 0.5 μm and about 2 μm. The spacing S3 between a bottom electrode 223 and a nearest dummy metal plate 225 may be between about 0.5 μm and about 2 μm. In each case the spacing S1, S2, and/or S3 should be no more than about 2 μm. The purpose of the dummy metal plates 225 is to pad the bottom electrode layer so that unevenness from voids between electrodes does not propagate to the bonding interface (discussed below). If the spacing S1, S2, and/or S3 is too great then such voids may form.

The spacing S1 between bottom electrodes 223 may vary based on the functional requirements of the bottom electrodes. Because the dummy metal plates 225 are non-functional, the spacing S2 between the dummy metal plates 225 may be regular, with the exception of avoiding the keep-out-zones, noted above. The density of the dummy metal plates 225 in areas where the dummy metal plates 225 are formed may be between 70% and about 99.5%, where the remainder is made of the spacing between the dummy metal plates 225. The density must be great enough to provide sufficient vertical padding. The spacing S2 and the density for the dummy metal plates 235 and dummy metal plates 245, discussed below, may be similar to the spacing S2 and the density for the dummy metal plates 225.

Figure 8B:
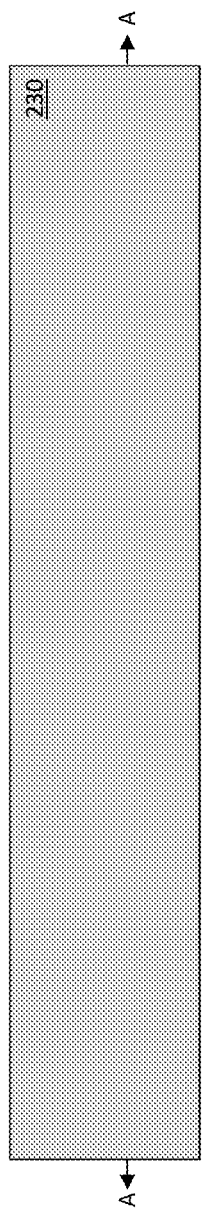
Figure 8A:
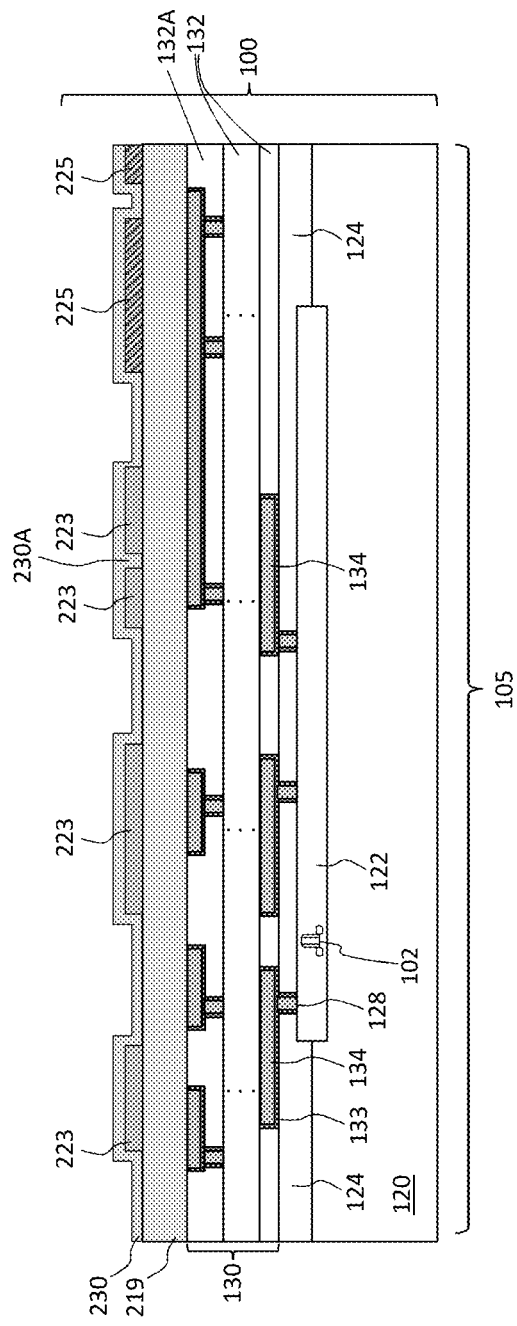

Referring to FIGS. 8A and 8B, a first capacitor insulator layer 230 is deposited over the bottom electrodes 223 and the dummy metal plates 225. The first capacitor insulator layer 230 may be deposited as a high-K dielectric layer via one or more deposition processes, such as, atomic layer deposition (ALD), chemical vapor deposition (CVD), physical vapor deposition (PVD), combinations thereof, and the like. The first capacitor insulating layer 230 is formed as a blanket insulating layer (e.g., dielectric film layer) over the bottom electrodes 223 and the dummy metal plates 225 such that the blanket insulating layer conforms to the planar surfaces of the bottom electrodes 223, the dummy metal plates 225, and the insulating layer 219. As such, the first capacitor insulating layer 230 is formed to comprise planar regions disposed over the planar surfaces of the insulating layer 219, the bottom electrodes 223, and the dummy metal plates 225, and is formed to include vertical or angular regions where the first capacitor insulating layer 230 transitions from the insulating layer 219 to the bottom electrode 223 or the dummy metal plate 225 and transitions from the bottom electrode 223 or the dummy metal plate 225 to the insulating layer 219.

In some embodiments, the first capacitor insulator layer 230 is formed as a composite layer of stacked dielectric layers. For example, the first capacitor insulator layer 230 may be formed as a layered stack of $ZrO_2/Al_2O_3/ZrO_2$ (ZAZ), which includes a first zirconium oxide ($ZrO_2$) layer, an aluminum oxide ($Al_2O_3$) layer over the first $ZrO_2$ layer, and a second $ZrO_2$ layer over the $Al_2O_3$ layer. ZAZ has the advantageous feature of having a low equivalent oxide thickness, and hence the capacitance value of the resulting capacitor is high. In accordance with other embodiments of the present disclosure, the first capacitor insulator layer 230 is formed as a single layer of a homogenous dielectric material such as zirconium oxide ($ZrO_2$). The first capacitor insulator layer 230 may be formed to a thickness of between about 20 Å and about 200 Å.

In some embodiments where the bottom electrode 223 is close to another bottom electrode 223 or the dummy metal plate 225, for example, if the bottom electrode 223 is less than about 0.5 μm from an adjacent bottom electrode 223 or the dummy metal plate 225, the first capacitor insulating layer 230 may have a portion with an upper surface which is higher than the upper surface of the bottom electrode 223 and a lower surface which is level with the lower surface of the bottom electrode 223, such as illustrated at portion 230A. In other words, a thickness of the first capacitor insulating layer 230 between two bottom electrodes 223 which are close together, two dummy metal plates 225 which are close together, or one of each which are close together, such as at portion 230A, may be greater than the thickness of a portion of the first capacitor insulating layer 230 which is over the bottom electrodes 223 or over the dummy metal plates 225. A similar occurrence may happen for each of the electrode layers and corresponding capacitor insulating layers.

Figure 9B:
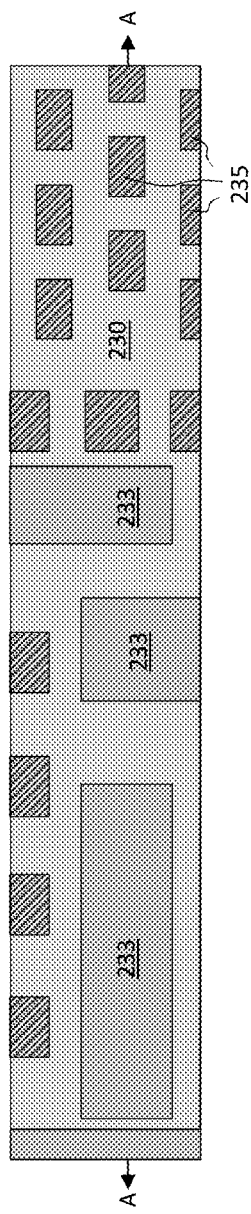
Figure 9A:
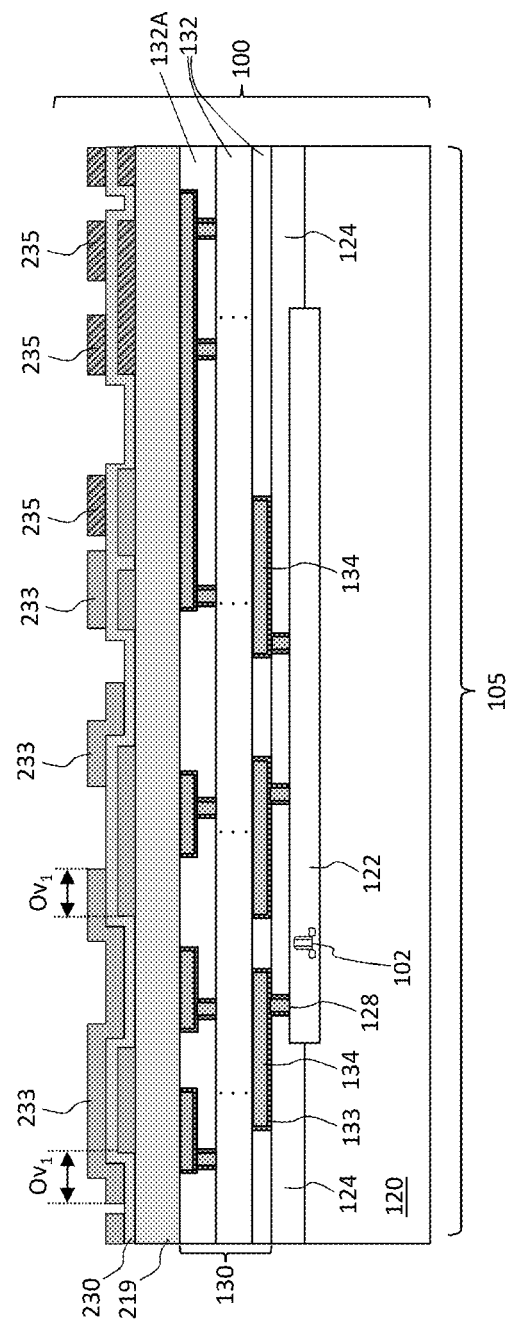

FIGS. 9A and 9B illustrate the formation of a middle electrode layer over the first capacitor insulator layer 230 and the patterning of the middle electrode layer into the middle electrodes 233 and the dummy metal plates 235 (which may also be referred to as the middle dummy metal plates 235). The middle electrode layer may be deposited as a blanket metal layer over the first capacitor insulator layer 230 using materials and processes as described above with respect to the bottom electrode layer 221. In particular, however, the middle electrode layer is formed to substantially conform to the first capacitor insulator layer 230. The middle electrode layer may be made of the same materials as the bottom electrode layer 221 or different materials. In some embodiments, the middle electrode layer may be formed to a thickness between about 400 Å and about 600 Å. However, any suitable material and any suitable thickness may be used for the middle electrode layer.

Once deposited, the blanket metal layer of the middle electrode layer may be etched to remove one or more portions of the blanket metal layer over the first capacitor insulator layer 301, thereby forming the middle electrodes 233 and the middle dummy metal plates 235. The etching may be done using processes and materials such as those described above with regard to etching the bottom electrode layer 221. The middle electrode layer may be etched using a same etching technique as used to etch the bottom electrode layer 221 or may be etched using a different etching technique.

The lengths, widths, and spacings of the middle electrodes 233 and the middle dummy metal plates 235 may be in the same ranges as described above with respect to the bottom electrodes 223 and the bottom dummy metal plates 225. However, any suitable dimensions may be used for the middle electrodes 233 and the middle dummy metal plates 235.

The middle electrodes 233 may overlap the edges of the bottom electrodes 223 by a distance $Ov_1$ between about 0.2 µm and about 1.0 µm. Further, according to some embodiments, the first end of a first middle electrode 233 overlies a first one of the bottom electrodes 223 and the second end of the first middle electrode 233 overlies a second one of the bottom electrodes 223. The middle dummy metal plates 235 may overlap one or more bottom electrodes 233.

Figure 10B:
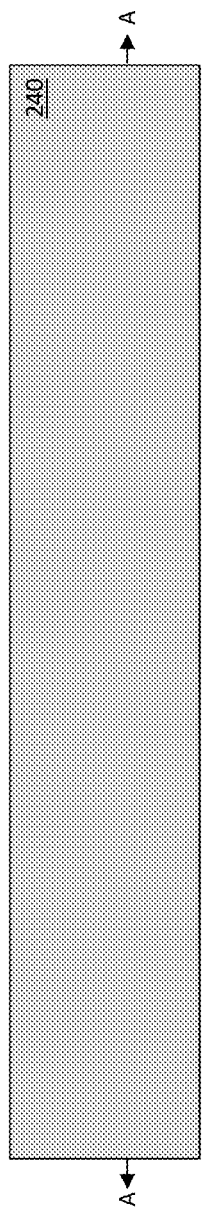
Figure 10A:
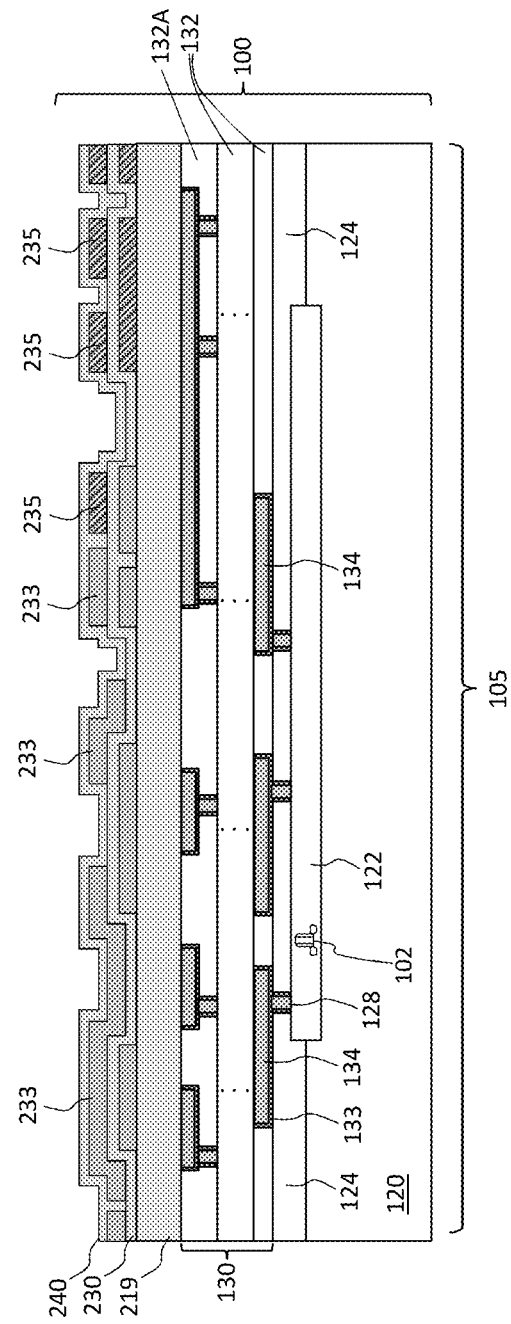

Referring to FIGS. 10A and 10B, a second capacitor insulator layer 240 is deposited over the middle electrodes 233, the middle dummy metal plates 235, and the first capacitor insulating layer 230. The second capacitor insulator layer 240 may be deposited as a high-K dielectric layer using one or more deposition processes as discussed above with regard to the first capacitor insulator layer 230. As such, the second capacitor insulating layer 240 is formed to comprise planar regions disposed over the planar surfaces of the first capacitor insulator layer 230, the middle electrodes 233, and the middle dummy metal plates 235, and is formed to comprise vertical or angled regions where the second capacitor insulator layer 240 transitions from the first capacitor insulator layer 230 to the middle electrode 233 or the middle dummy metal plate 235 and transitions from the middle electrode 233 or the middle dummy metal plate 235 to the first capacitor insulator layer 230.

The second capacitor insulator layer 240 may be deposited using the same materials and same processes used to deposit the first capacitor insulator layer 230. However, the materials and processes used to deposit the second capacitor insulating layer 240 may be different from the materials and processes used to deposit the first capacitor insulator layer 230.

In some embodiments, the second capacitor insulator layer 240 is formed as a composite layer of stacked dielectric layers (e.g., ZAZ). In accordance with other embodiments of the present disclosure, the second capacitor insulator layer 240 is formed as a single layer of a homogenous dielectric material (e.g., $ZrO_2$) The second capacitor insulator layer 240 may be formed to a thickness of between about 20 Å and about 200 Å.

Figure 11B:
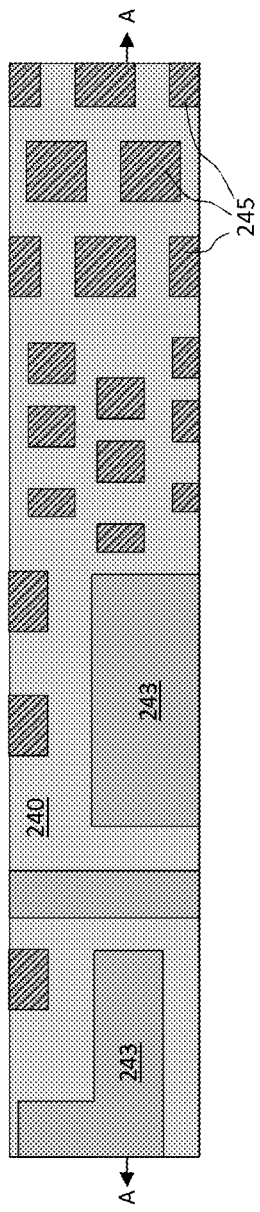
Figure 11A:
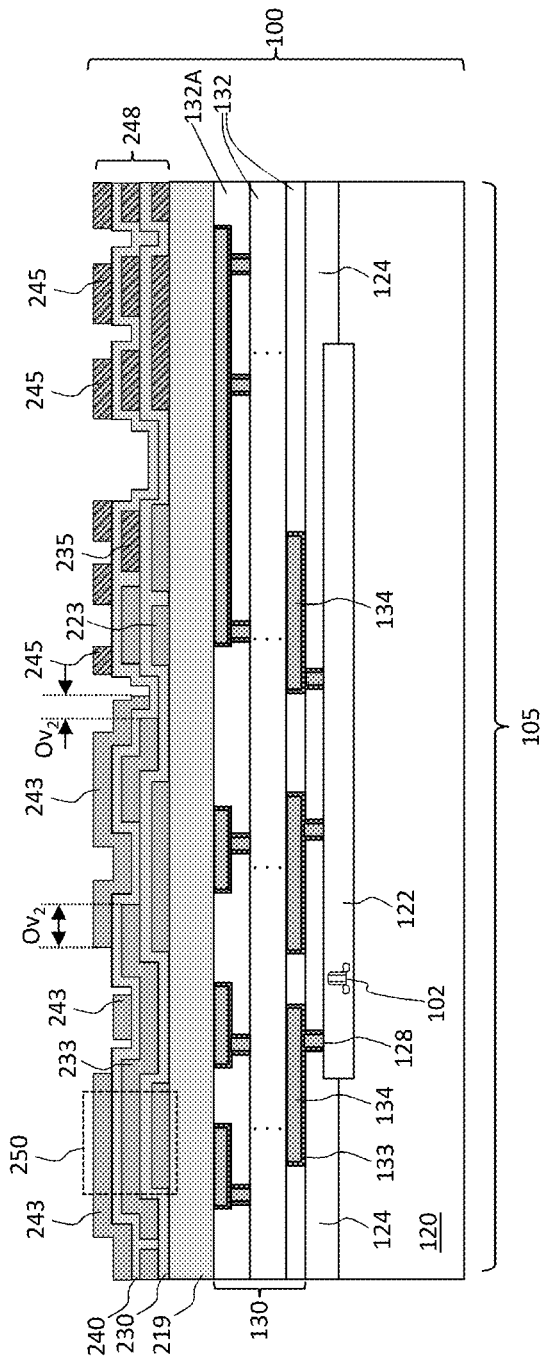

FIGS. 11A and 11B illustrate the formation of a top electrode layer over the second capacitor insulator layer 240 and the patterning of the top electrode layer into the top electrodes 243 and the top dummy metal plates 245 (which may also be referred to as the top dummy metal plates 245).

The top electrode layer may be deposited as a blanket metal layer over the second capacitor insulator layer 240 using materials and processes as described above with respect to the bottom electrode layer 221. In particular, however, the top electrode layer is formed to substantially conform to the second capacitor insulator layer 240. The top electrode layer may be made of the same materials as the bottom electrode layer 221, the middle electrodes 233, or different materials. In some embodiments, the top electrode layer may be formed to a thickness between about 400 Å and about 600 Å. However, any suitable material and any suitable thickness may be used for the top electrode layer.

Once deposited, the blanket metal layer of the top electrode layer may be etched to remove one or more portions of the blanket metal layer over the second capacitor insulator layer 240, thereby forming the top electrodes 243 and the top dummy metal plates 245. The etching may be done using processes and materials such as those described above with regard to etching the bottom electrode layer 221. The top electrode layer may be etched using a same etching technique as used to etch the bottom electrode layer 221, the middle electrodes 233, or may be etched using a different etching technique.

The lengths, widths, and spacings of the top electrodes 243 and the top dummy metal plates 245 may be in the same ranges as described above with respect to the bottom electrodes 223 and the bottom dummy metal plates 225. However, any suitable dimensions may be used for the top electrodes 243 and the top dummy metal plates 245.

The top electrodes 243 may overlap the edges of the middle electrodes 233 by a distance $Ov_2$ between about 0.2 µm and about 1.0 µm. Further, according to some embodiments, the first end of a first top electrode 243 overlies a middle electrode 233 and the second end of the first top electrode 243 overlies a second middle electrode 233. The top dummy metal plates 245 may overlap one or more middle electrodes 233 and/or bottom electrodes 223.

As shown in FIG. 11A, the bottom electrodes 223, the middle electrodes 233, and the top electrodes 243 are arranged in a stack with the first capacitor insulating layer 230 and the second capacitor insulating layer 240 separating the middle electrodes 233 from each of the bottom electrodes 223 and the top electrodes 243. The stacked arrangement of electrode layers separated by insulating layers forms a super high density metal-insulator-metal (SHDMIM) capacitor 250 over the top metal lines 134A of the interconnect structure 130. The various electrode layers are padded vertically by the dummy metal plates 225, 235, and 245. As a result, a subsequently deposited insulating layer can have a substantially flat upper surface, rather than a stepped, tiered, or wavy upper surface as would occur without the dummy metal plates 225, 235, and 245. It should be understood that any number of SHDMIM capacitors 250 may be formed.

The overall thickness of the SHDMIM capacitor layers 248 as measured from the uppermost surface of the top electrodes 243 to the bottom surface of the bottom electrodes 223 may be between about 1200 Å and about 2200 Å, though other thicknesses are contemplated and may be used. Without the dummy metal plates 225, 235, and 245, areas which do not have electrodes from the SHDMIM capacitors 250 would have a thickness between 0 Å and 400 Å. The thickness in such areas would be 0 Å in embodiments where the first and second capacitor insulating layers 230 and 240 do not extend across the insulating layer 219 and up to about 400 Å in embodiments where the first and second capacitor insulating layers 230 and 240 do extend across the insulating layer 219. This thickness can step up and down across the insulating layer 219. The variance can propagate up to the upper surface of the cap insulating layer 260 (see FIG. 12A), causing stepped vertical gaps in the upper surface. With the inclusion of dummy metal plates such as the dummy metal plates 225, 235, and 245, however, the overall thickness of the SHDMIM capacitor layers 248 is relatively uniform.

Turning to FIGS. 12A and 12B, a cap insulating layer 260 is formed over the top electrodes 243, the top dummy metal plates 245, and exposed portions of the second capacitor insulator layer 240. According to some embodiments, the cap insulating layer 260 is formed over these layers as a plasma enhanced oxide undoped silicon glass (PEOX-USG) to a thickness between about 1000 Å and about 4000 Å. The cap insulating layer 260 may be formed as a blanket layer over the top electrodes 243, the top dummy metal plates 245, and exposed portions of the second capacitor insulating layer 240 using Plasma Enhance Chemical Vapor Deposition (PECVD), Low-Pressure Chemical Vapor Deposition (LPCVD), Atomic Layer Deposition (ALD), or the like. However, any suitable material, any suitable thickness and any suitable method may be utilized to form the cap insulating layer 260.

As such, the insulating layer 219 and cap insulating layer 260, along with the various layers of the SHDMIM capacitor 250 and the dummy metal plates 225, 235, and 245 collectively form a passivation structure 200 having integrated SHDMIM capacitor devices and dummy metal plates formed therein.

Figure 13B:
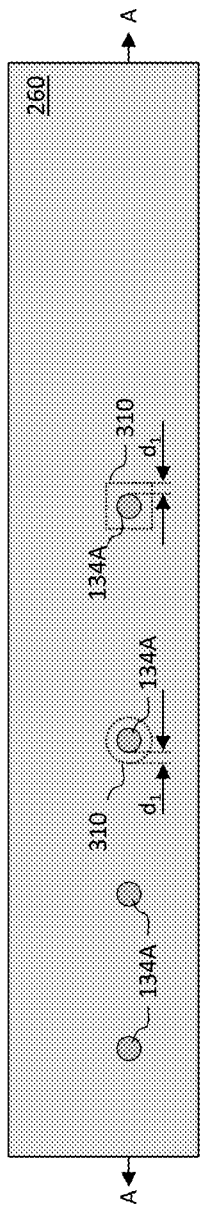
Figure 13A:
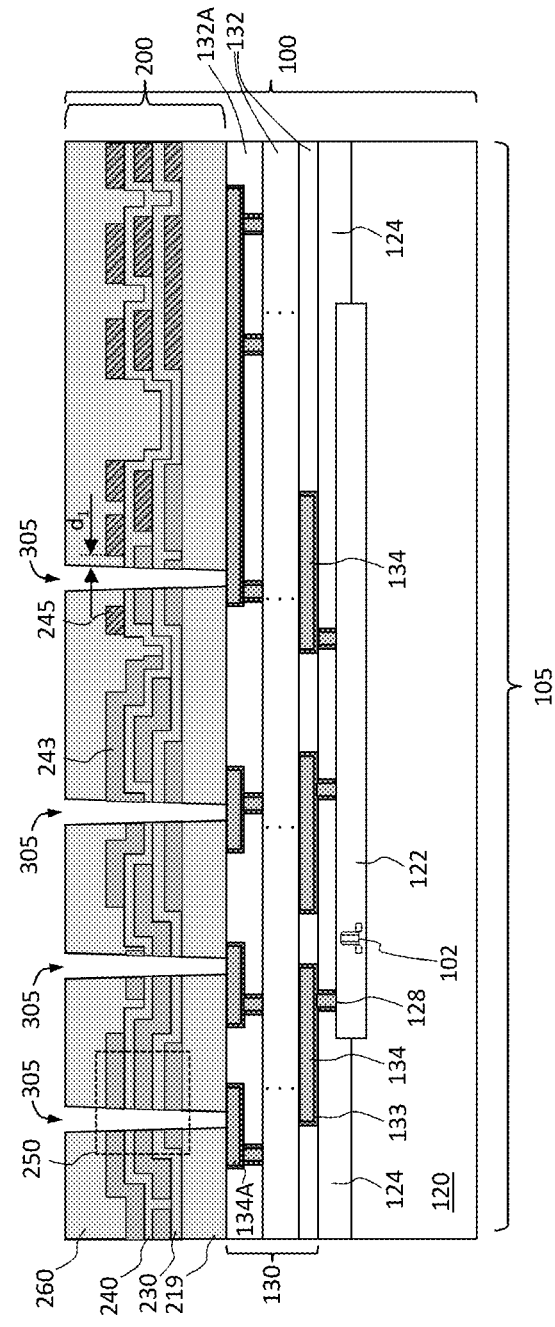

In FIGS. 13A and 13B, via openings 305 may next be formed in the cap insulating layer 260 and through the top electrodes 243, the second capacitor insulating layer 240, the middle electrodes 233, the first capacitor insulating layer 230, the bottom electrodes 223, the insulating layer 219, and the etch stop layer 138 (if used). One or more photo lithography processes (e.g., damascene or dual damascene process) are performed in order to create the via openings 305 in order to expose a contact area of the top metal lines 134A of the interconnect structure 130. However, any number and any suitable lithography processes may be used to form the via openings.

In some embodiments, the via openings 305 may be formed using a photo lithographic process using, for example, photo resists and/or hard masks which are formed and patterned over cap insulating layer 260. An anisotropic etch may be used to form these trenches through the photo resists and/or hard masks in each successive layer using appropriate etchants until the top metal lines 134A are exposed in the via openings 305. In some embodiments, one or more of the top electrodes 243, the middle electrodes 233, and the bottom electrodes 223 may not be etched in forming a particular opening 305, such as illustrated in FIG. 13A. The location of the via openings 305 and the dummy metal plates 225, 235, and 245 are such that the via openings 305 do not etch through the dummy metal plates 225, 235, and 245. A first keep out zone (KOZ) 310 may be established to keep dummy metal plates 225, 235, and 245 away from the via openings 305. The KOZ 310 may be circular or square (or any suitable shape) and establish a minimum distance $d_1$ between the via openings 305 and the nearest dummy metal plates 225, 235, and 245. The distance $d_1$ may be between 0.5 μm and about 5 μm. The dummy metal plates 225, 235, and 245 are disposed outside the KOZ 310.

Figure 14B:
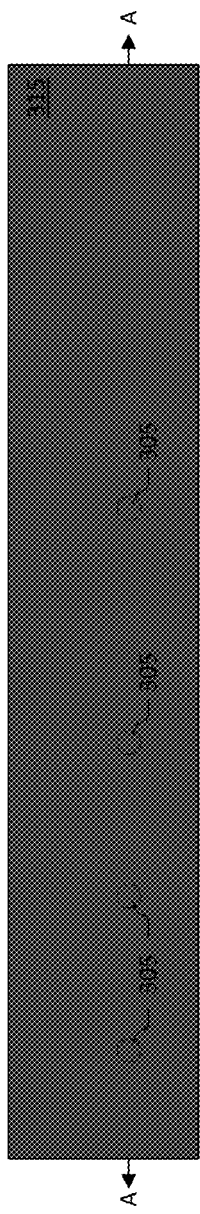
Figure 14A:
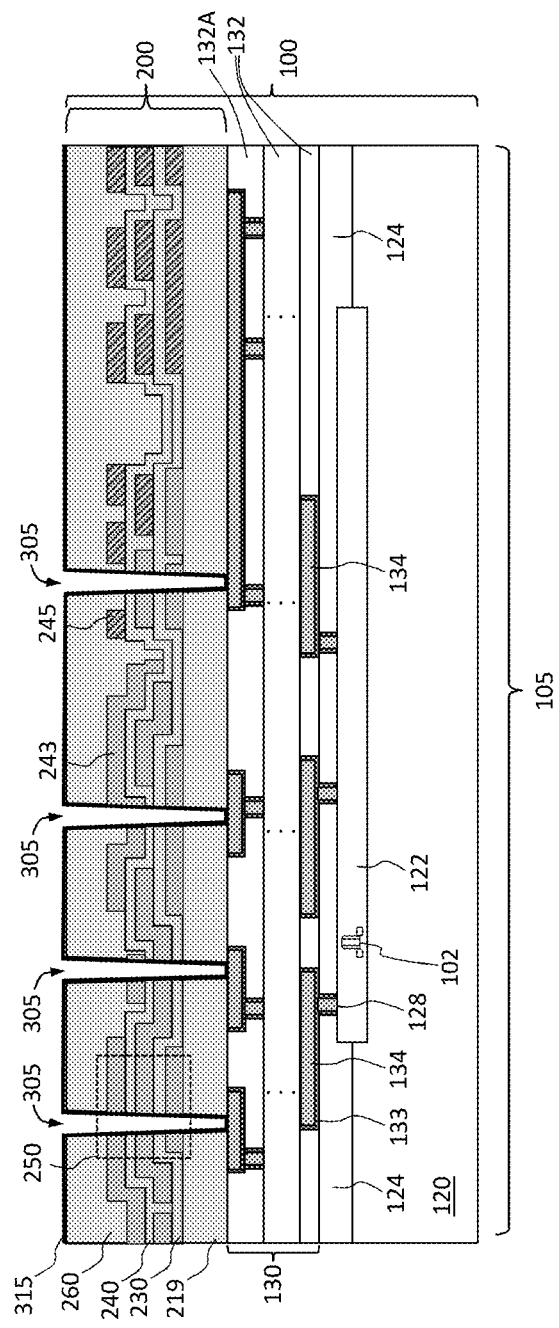

In FIGS. 14A and 14B a plug diffusion barrier layer 315 is formed over the passivation structure 200 conforming to the planar surfaces of the cap insulating layer 260 and conforming to the sidewalls of the via openings 305 and conforming to the exposed contact areas of the top metal lines 134A. Because of the dummy metal plates 225, 235, and 245, the upper surface of the plug diffusion barrier layer 315 is substantially flat, rather than stepped, wavy, or tiered. In some embodiments, the plug diffusion barrier layer 315 is formed of one or more layers of conductive materials, such as titanium (Ti), titanium nitride (TiN), tantalum (Ta), tantalum nitride (TaN), or the like. In some embodiments, the plug diffusion barrier layer 315 is formed of a thin layer of tantalum nitride (TaN) deposited by chemical vapor deposition techniques. According to some embodiments, the plug diffusion barrier layer 315 may be formed to a thickness between about 500 Å and about 2000 Å. However, any suitable material, any suitable deposition method and any suitable thickness may be used for the plug diffusion barrier layer 315.

Figure 15B:
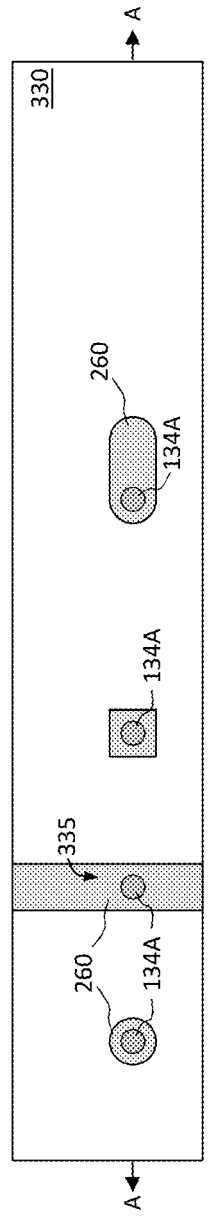
Figure 15A:
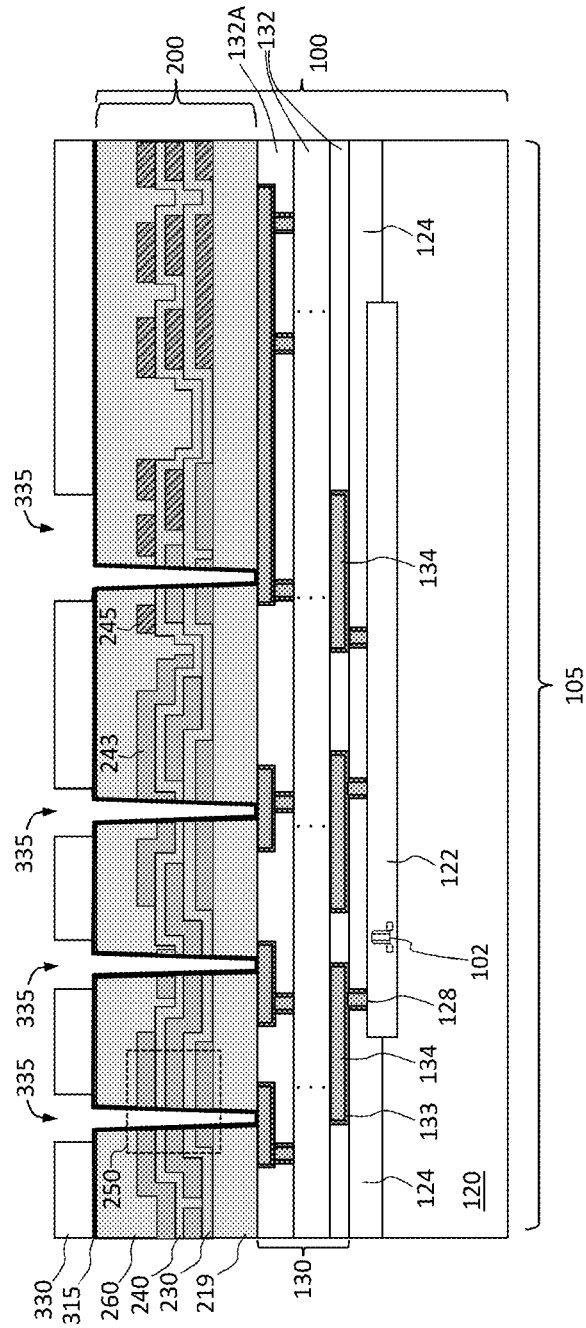

FIGS. 15A and 15B through 16A and 16B illustrate the formation of the conductive plugs 340 and conductive landings 345 (FIGS. 16A and 16B), in accordance with some embodiments. In FIGS. 15A and 15B, once the plurality of via openings 305 has been formed, a photoresist 330 is applied over the plug diffusion barrier layer 315. After the photoresist has been applied, the photoresist 330 may be patterned and developed to form openings 335 in various shapes according to upper portions of the conductive plugs 340 and the conductive landings 345. As illustrated in FIG. 15B, the shapes may be lines, squares, circles, ovals, rounded rectangles, and so forth. FIG. 15B omits the view of the plug diffusion barrier layer 315 in order to illustrate details beneath the plug diffusion barrier layer 315.

In FIGS. 16A and 16B, the via openings 305 and openings 335 may be filled with a conductive fill material by, for example, performing a deposition process to a thickness such that the conductive fill material fills the via openings 305 and overfills the via openings 305 such that a conductive layer of the conductive fill extends above the via openings 305 and fills at least a portion of the openings 335 over the plug diffusion barrier layer 315, thereby forming the conductive plugs 340 (shown in phantom in FIG. 16B) within the via openings 305 (FIGS. 14A and 14B) and the conductive landings 345 within the openings 335 (FIGS. 15A and 15B) and extending above the passivation structure 200 and horizontally over an upper surface of the passivation structure 200. The conductive fill material comprises metals, elemental metals, transitional metals, or the like. In some embodiments, the conductive fill material comprises one or more of copper, aluminum, tungsten, cobalt, or alloys thereof (e.g., an aluminum copper alloy (AlCu)). The conductive fill material may be formed using a selective plating technique such as electro-less plating. In some embodiments, the conductive fill material may be formed by depositing a seed layer (not shown) and performing an electrochemical plating process. However, any suitable material and any suitable technique may be used for the conductive fill material.

In some embodiments, once deposited, the conductive fill material may be subjected to a planarization process, such as a chemical-mechanical process (CMP) to planarize the surface and to remove excess deposits of the conductive fill material used to form the conductive landings 345. Some embodiments may omit the planarization process because the dummy metal plates 225, 235, and 245 cause a substantially level upper surface of the passivation structure 200 which results in a substantially level upper surface of the conductive landings 345. In an embodiment, the thickness of the conductive landings 345 is between about 1,000 Å and about 10,000 Å. However, any suitable thickness may be used. In an embodiment, the thickness of the conductive plugs 340 through the passivation structure 200 is between about 1,000 Å and about 10,000 Å. However, any suitable thickness may be used and will depend on the thickness of the passivation structure 200.

FIGS. 16A and 16B also illustrate that the photoresist 330 may be removed and an etching process may be performed to remove undesired portions of the plug diffusion barrier layer 315 exposed from the conductive landings 345. Thus, the conductive plugs 340 are formed through the passivation structure 200 and the conductive landings 345 are formed over the passivation structure 200 which are continuous with the conductive plugs 340. The conductive plugs 340 and the conductive landings 345 extend through the passivation structure 200, including the SHDMIM capacitor 250 and are electrically coupled to the top metal lines 134A. As such, the conductive landings 345 form contacts of electrodes of the SHDMIM capacitor 250.

In some embodiments, the conductive landings 345 may be directly probed for performing chip probe (CP) testing of the wafer 100. Optionally, solder regions (e.g., solder balls or solder bumps) may be disposed on the conductive landings 345 and the solder regions may be used to perform CP testing on the wafer 100. CP testing may be performed on the wafer 100 to ascertain whether the each device die 105 of wafer 100 is a known good die (KGD). Thus, only device dies 105 which are KGDs undergo subsequent processing for packaging, and dies which fail the CP testing are not packaged. After testing, the solder regions (if any) may be removed in subsequent processing steps.

In FIGS. 17A and 17B, a second passivation structure 350 may then be formed over the passivation structure 200 and the conductive landings 345. The second passivation structure 350 may be deposited as a blanket layer over the top portions of the conductive landings 345 and over exposed portions of the cap insulating layer 260 of the passivation structure 200. According to some embodiments, the material of the second passivation structure 350 may include a plasma enhanced oxide undoped silicon glass (PEOX-USG), oxide (such as silicon oxide), nitride (such as silicon nitride), carbide, oxy-carbide, and so forth, or combinations thereof to a thickness between about 500 Å and about 5,000 Å. The second passivation structure 350 may be formed as a blanket layer using Plasma Enhance Chemical Vapor Deposition (PECVD), Low-Pressure Chemical Vapor Deposition (LPCVD), Atomic Layer Deposition (ALD), or the like. In some embodiments, the second passivation structure 350 may be made from multiple layers of the same or different materials. In some embodiments, a planarization process (e.g., CMP) may be used to planarize the surface of the second passivation structure 350. In some embodiments, the planarization process may be omitted or may have a reduced planarization time because the dummy metal plates 225, 235, and 245 provide more level conductive landings 345 and hence a more level upper surface of the second passivation structure 350. However, any suitable material, any suitable thickness and any suitable method may be utilized to form the second passivation structure 350.

Figure 18B:
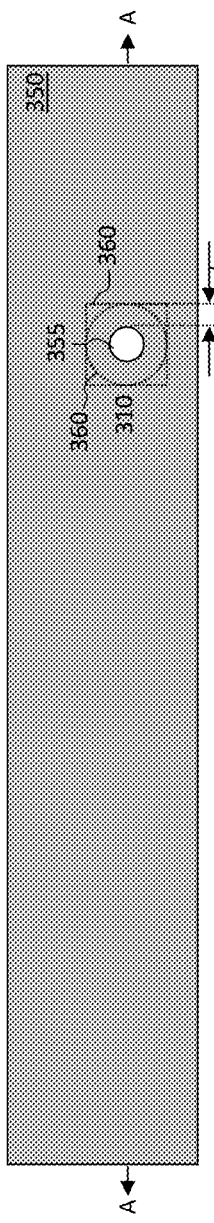
Figure 18A:
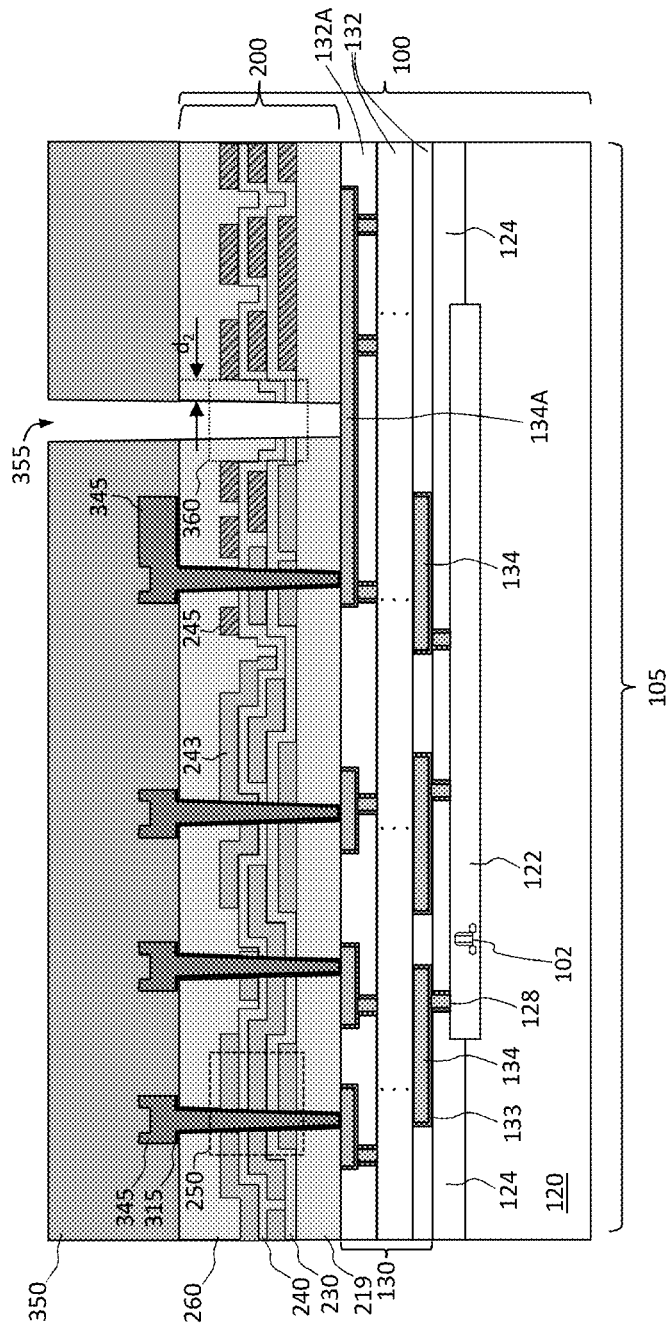

In FIGS. 18A and 18B, the contact openings 355 are formed through the second passivation structure 350 and the passivation structure 200 to expose a portion of the top metal lines 134A for subsequently formed bond pad vias 375. The contact openings 355 may be formed using any suitable photolithographic mask and etching process. For example, the passivation structure 200 and the second passivation structure 350 may be patterned using any suitable lithographic process. In an embodiment, a photo resist layer may be deposited as a blanket layer over the second passivation structure 350 and patterned to expose areas of the second passivation structure 350 where the contact openings 355 are to be formed. The exposed areas of the second passivation structure 350 are subjected to an etching process (e.g., a wet or dry etch using, in some embodiments, using suitable etchants such as gaseous phosphoric acid ($H_3PO_4$), chlorine ($Cl_2$) (or compounds of chlorine)) to remove material of the second passivation structure 350 so that areas of the passivation structure 200 are exposed through the contact openings 355 in the second passivation structure 350.

Once the areas of the passivation structure 200 are exposed through the contact openings 355, the exposed areas of the passivation structure 200 are subjected to the etching process (e.g., a plasma enhanced etch using the suitable etchants, including the above gases and/or tetrafluoromethane ($CF_4$)) until portions of the top metal lines 134A of the interconnect structure 130 are exposed through the contact openings 355. This includes etching the first capacitor insulating layer 230 and the second capacitor insulating layer 240. In some embodiments, the etching may include etching through one or more of the bottom electrodes 223, the middle electrodes 233, and/or the top electrodes 243, for example to expose them to make a connection to them by a subsequently formed bond pad via 375 in the contact openings 355. The etching does not include, however, etching the dummy metal plates 225, 235, or 245 because of a keep out zone (KOZ) 360 disposed around the contact openings 355. The dummy metal plates 225, 235, and 245 are disposed outside the KOZ 360.

As noted in FIG. 18B the KOZ 360 may be any suitable shape, with the shapes of a square or circle given as examples. The KOZ 360 establish a minimum distance $d_2$ between the contact openings 355 and the nearest dummy metal plates 225, 235, and 245. The distance $d_2$ may be between 0.5 µm and about 5 µm. The dummy metal plates 225, 235, and 245 are disposed outside the KOZ 360.

All, some or none of the photo resist layer may be consumed during the etching of the second passivation structure 350 and the passivation structure 200 and any remaining photo resist material may be removed, e.g., by an ashing process. However, any suitable material, any suitable deposition and any suitable removal process may be utilized for the photo resist and any suitable etching process may be utilized to form the contact openings 355.

In FIGS. 19A and 19B, the bond pad openings 365 may be formed in the upper portion of the second passivation structure 350. The bond pad openings 365 may be formed using any suitable photolithographic mask and etching process. In an embodiment, a photo resist layer may be deposited as a blanket layer over the second passivation structure 350 and patterned to expose areas of the second passivation structure 350 where the bond pad openings 365 are to be formed. The exposed areas of the second passivation structure 350 are subjected to an etching process (e.g., a wet or dry etch) in some embodiments, using suitable etchants to remove material of the second passivation structure 350. In some embodiments, the etching process may stop on an etch stop layer disposed under a bond pad layer of the second passivation structure 350. In other embodiments, the etching process may be a time-based etching process. As noted in FIG. 19A, the bond pad openings 365 may be formed surrounding an upper portion of the contact openings 355.

In FIGS. 20A and 20B, the bond pad vias 375 and the bond pads 380 may be formed. First a diffusion barrier layer 370 may be formed. The diffusion barrier layer 370 may be formed using processes and materials similar to those discussed above with respect to the plug diffusion barrier layer 315 of FIGS. 14A and 14B. Next, the bond pad vias 375 and the bond pads 380 may be formed by filling in the contact openings 355 and the bond pad openings 365 with a conductive fill. The conductive fill may include any suitable material, such as a conductive material selected from tungsten, aluminum, copper, titanium, tantalum, titanium nitride, tantalum nitride, alloys thereof, and/or multi-layers thereof. In some embodiments, the conductive fill may include copper or a copper alloy. The conductive fill may be deposited using any suitable process, such as by an electro plating or electroless plating technique, or by using Plasma Enhance Chemical Vapor Deposition (PECVD), Low-Pressure Chemical Vapor Deposition (LPCVD), Atomic Layer Deposition (ALD), or the like. In some embodiments, the conductive fill may be deposited higher than the surface of the second passivation structure 350. The conductive fill material may be subjected to a planarization process, such as a chemical-mechanical polishing process (CMP) to planarize the surface and to remove excess deposits of the conductive fill material used to form the bond pads 380.

Although, the bond pad vias 375 and the bond pads 380 are described and illustrated as being formed in the same process, it some embodiments, the bond pad vias 375 may be completely formed first, then the bond pads 380 formed in a separate process. In such embodiments, a separate dielectric layer may be formed as an upper layer of the second passivation structure 350 and the bond pad openings 365 formed in the separate dielectric layer, then filled to form the bond pads 380 in a separate process.

Figure 21A:
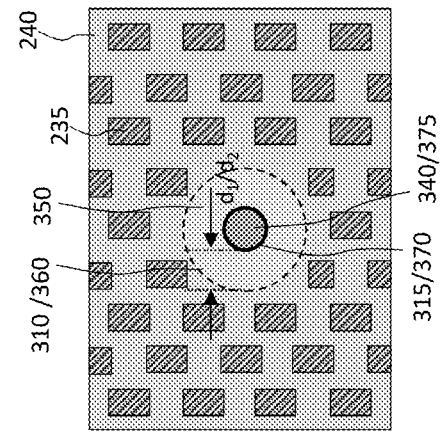
FIGS. 21A, 21B, 21C, and 21D illustrate views of a dummy metal plate layer, in accordance with some embodiments.
Figure 21B:
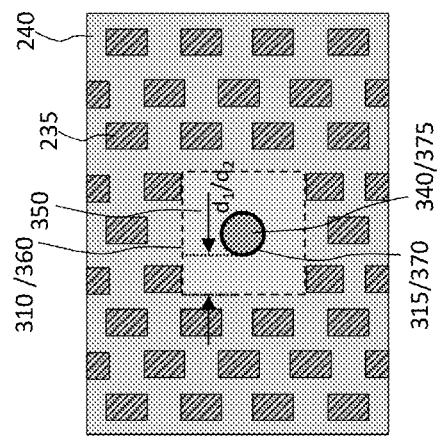

FIGS. 21A and 21B illustrate a portion of a top-down view the second capacitor insulating layer 240, in accordance with some embodiments. The structure illustrated in FIGS. 21A and 21B are similar to that of FIG. 20A through the line B-B. The second capacitor insulating layer 240 is illustrated as well as the middle dummy metal plates 235. FIGS. 21A and 21B each illustrate the KOZ 310 or the KOZ 360. FIG. 21A illustrates that the KOZ 310 or the KOZ 360 may be rectangular. FIG. 21B illustrates that the KOZ 310 or the KOZ 360 may be circular. The shape of the KOZ 310 or the KOZ 360 may be any suitable shape, such as a polygon having three to twelve sides which may or may not be of equal length, and so forth. The KOZ 310 or the KOZ 360 ensures that the dummy metal plates 225, 235, and 245 do not interfere with the conductive plugs 340 or the bond pad vias 375. The dummy metal plates 225, 235, and 245 which are in close proximity, i.e., adjacent to the KOZ 310 or the KOZ 360 may have altered positions and sizes in order to maintain the KOZ 310 or the KOZ 360. Thus, in an otherwise regular pattern of the dummy metal plates 225, 235, or 245, the dummy metal plates 225, 235, or 245 which are close to the KOZ 310 or the KOZ 360 may break the pattern and/or sizing to stay apart from the KOZ 310 or the KOZ 360.

In some embodiments, the pattern and sizes of the dummy metal plates 225, 235, and 245 in each layer may be the same, with each of the dummy metal plates 225, 235, and 245 stacked on each other. In other embodiments, the pattern and/or sizes of the dummy metal plates 225, 235, and 245 may be different in each layer and an overlap between each layer (e.g., such as OV1 and/or OV2 in FIGS. 9A and 11A) may be realized.

Figure 21C:
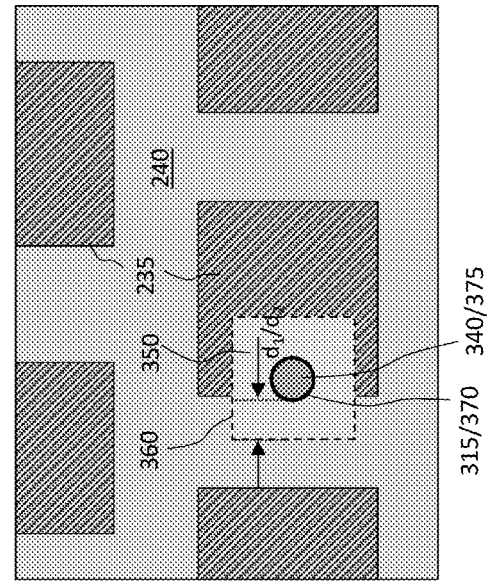
Figure 21D:
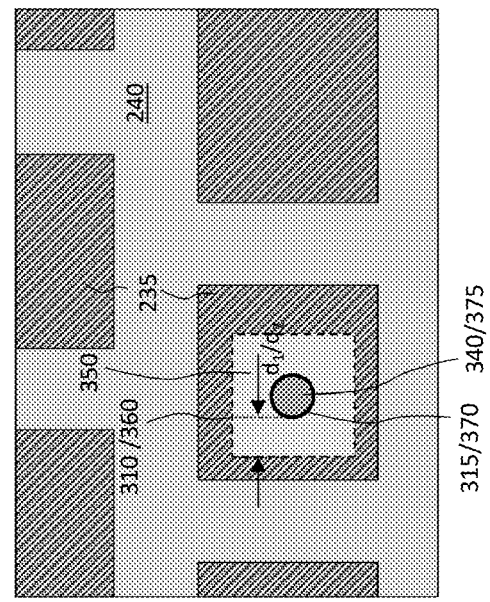

FIGS. 21C and 21D are similar to FIGS. 21A and 21B, but illustrate that dummy metal plates 235 (or 225 or 245) may be patterned to include a cut out to accommodate the KOZ 310 or the KOZ 360. FIG. 21C illustrates that the cut out can be such that a single one of the dummy metal plate 225, 235, or 245 surrounds the conductive plugs 340 or bond pad vias 375 outside the KOZ 310 or the KOZ 360. FIG. 21D illustrates that the cut out can be such that a single one of the dummy metal plates 225, 235, or 245 partially surrounds, on two sides or on three sides, the conductive plugs 340 or bond pad vias 375 outside the KOZ 310 or the KOZ 360.

Figure 22:
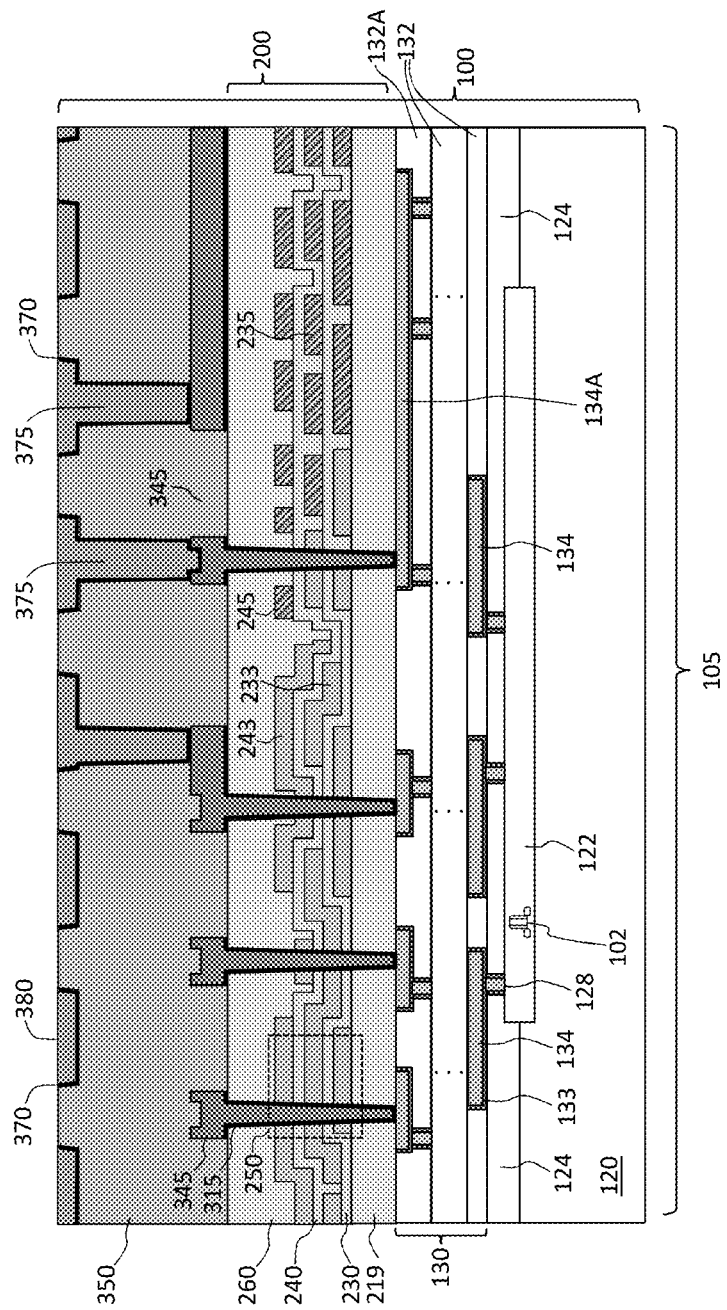
FIGS. 22 through 24 illustrate various configurations of a packaged device, in accordance with some embodiments.
Figure 23:
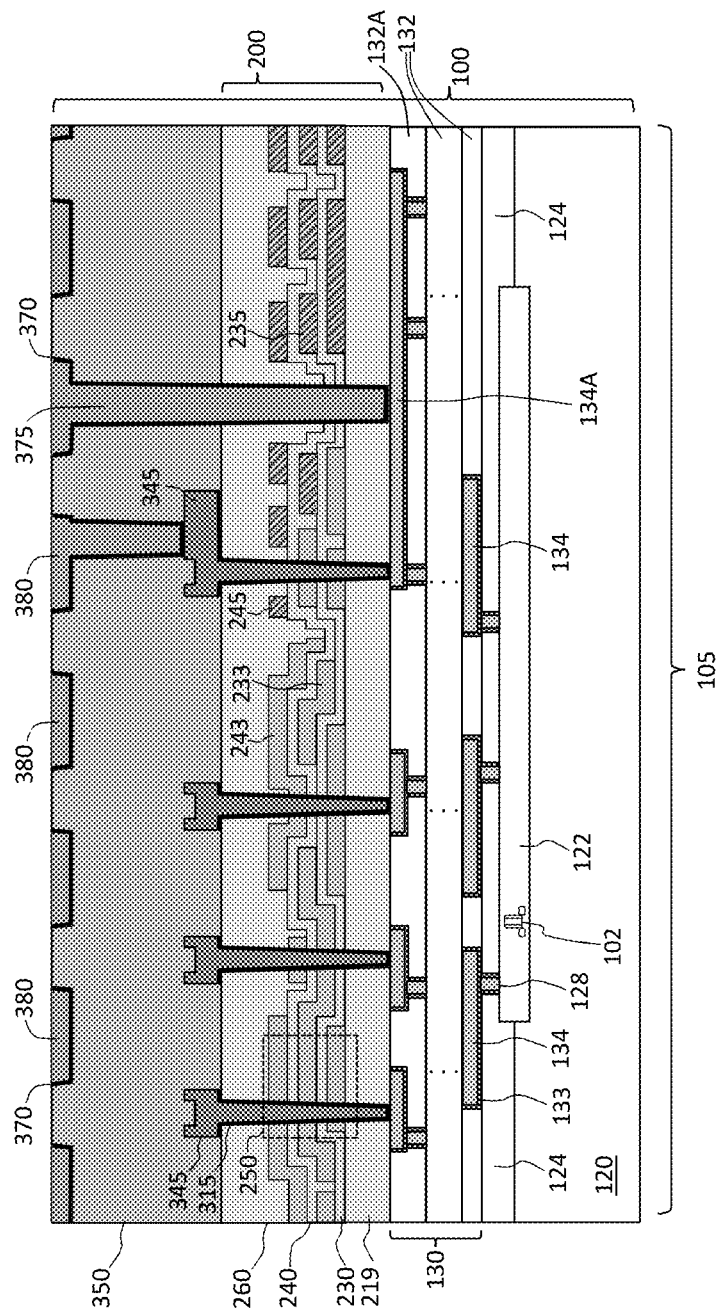
Figure 24:
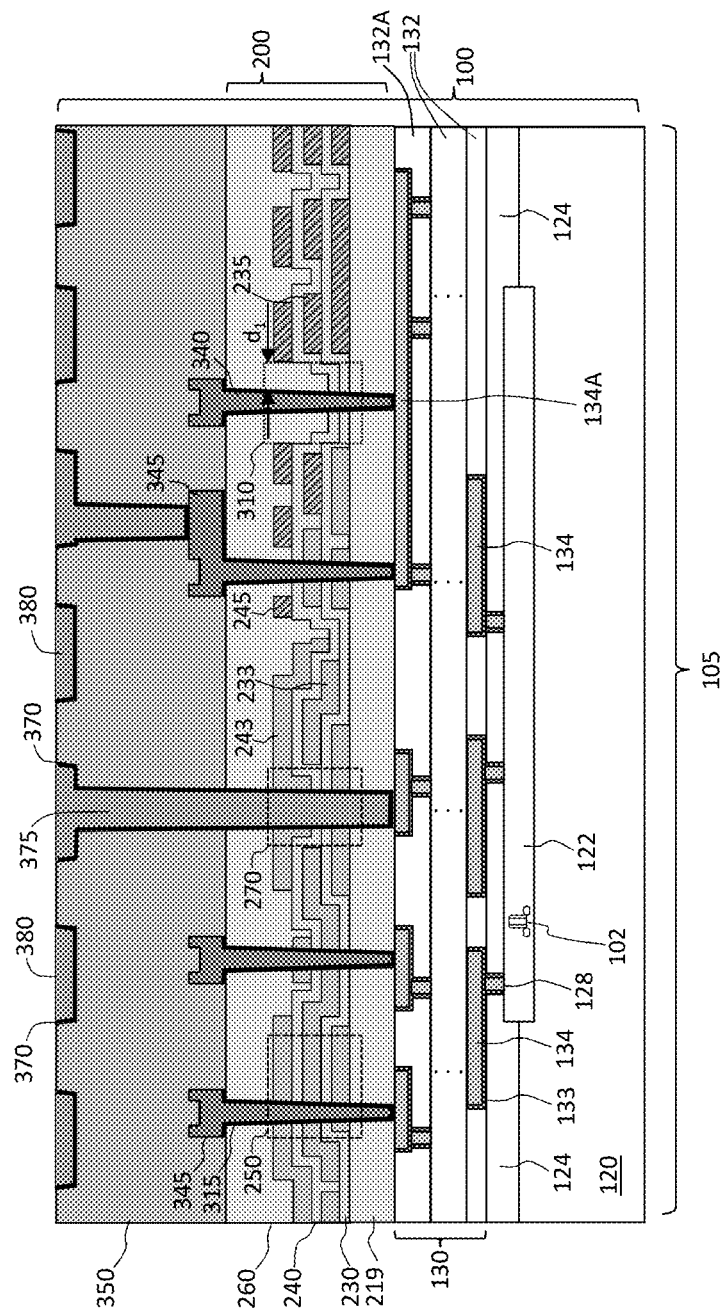

FIGS. 22 through 24 illustrate different configurations of the bond pad vias 375, the conductive plugs 340, and the conductive landings 345, in accordance with some embodiments. FIG. 22 illustrates an embodiment where the bond pad vias 375 traverse the second passivation structure 350 and land on the conductive landings 345. In such embodiments, the KOZ 360 may be omitted for the bond pad vias 375. FIG. 22 also illustrates that in all embodiments where the bond pad vias 375 may land on the conductive landings 345, the bond pad vias 375 may land on the conductive landings 345 at a place coinciding of a depression in the upper surface of the conductive landings 345, where the bottom of the bond pad via 375 conforms to the depression.

FIG. 23 illustrates an embodiment where the bond pad vias 375 may land on both the conductive landings 345 and the top metal lines 134A. The KOZ 360 may be omitted for bond pad vias 375 which land on the conductive landings 345 and kept for bond pad vias 375 which land on the top metal lines 134A.

FIG. 24 illustrates an embodiment where the bond pad vias 375 may contact the bottom electrodes 223, the middle electrodes 233, and/or the top electrodes 243 to form a SHDMIM capacitor, such as the SHDMIM capacitor 270. FIG. 24 also illustrates an embodiment where the conductive plug 340 utilizes a KOZ 310 as it passes through the layers of the dummy metal plates 225, 235, and 245, to ensure the dummy metal plates 225, 235, and 245 do not interfere with the conductive plug 340.

Figure 25:
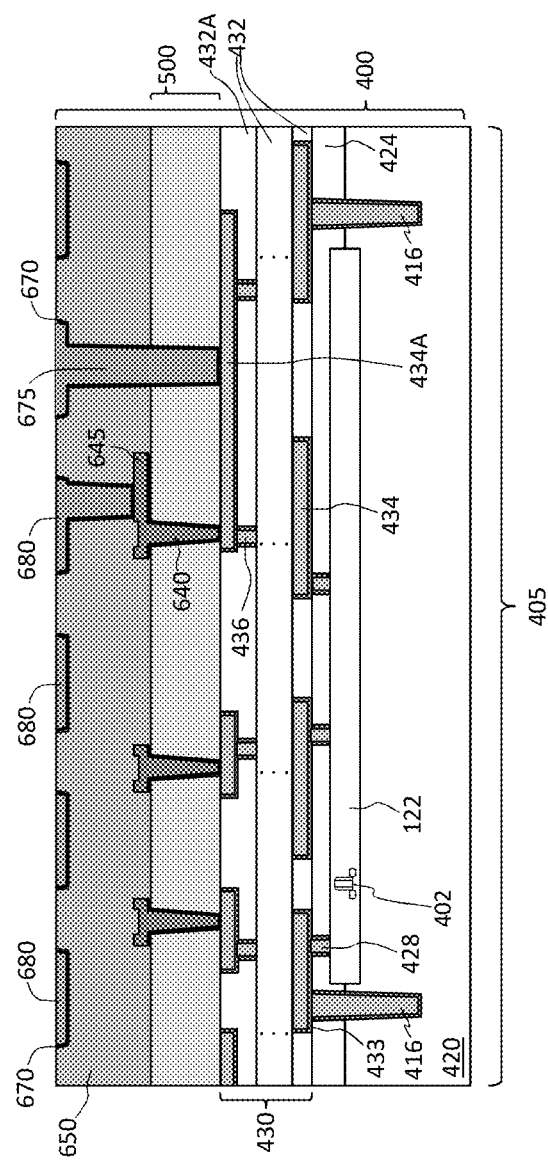
FIGS. 25 through 27 illustrate a second package component and the bonding of the second package component to the first package component.

FIG. 25 illustrates the formation of wafer 400, which includes the device dies 405 therein. In accordance with some embodiments of the present disclosure, the device dies 405 are logic dies, which may be CPU dies, MCU dies, IO dies, Base-Band dies, or AP dies. The device dies 405 may also be memory dies. Wafer 400 includes semiconductor substrate 420, which may be a silicon substrate.

The device dies 405 may include the integrated circuit devices 422, the ILD 424 over the integrated circuit devices 422, and the contact plugs 428 to electrically connect to the integrated circuit devices 422. The device dies 405 may also include the interconnect structures 430 for connecting to the active devices and passive devices in device dies 405. The interconnect structures 430 include the metal lines 434 and the vias 436.

Through-Silicon Vias (TSVs) 416, sometimes referred to as through-semiconductor vias or through-vias, are formed to penetrate into the semiconductor substrate 420 (and eventually through the semiconductor substrate 420 by revealing from the opposite side). The TSVs 416 are used to connect the devices and metal lines formed on the front side (the illustrated top side) of semiconductor substrate 420 to the backside. The TSVs 416 may be formed using processes and materials similar to those used to form the bond pads 380 and or the bond pad vias 375, discussed above, and are not repeated, including for example a time-based etching process so that the TSVs 416 may have a bottom which is disposed between the top surface and the bottom surface of the semiconductor substrate 420 and may be surrounded by a diffusion barrier layer.

The device die 405 may include a first passivation structure 500 having integrated SHDMIM devices and a second passivation structure 650. The integrated SHDMIM devices are not illustrated for simplicity. Conductive plugs 640 and conductive landings 645 may be formed and disposed in the first passivation structure 500 and second passivation structure 650. The bond pad 680 and the bond pad vias 675 are also formed and disposed in the first passivation structure 500 and second passivation structure 650.

The processes and materials used to form the various features of the device die 405 may be similar to the process and materials used to form their corresponding features in the device die 105, and hence the details are not repeated herein. Wafer 400 is singulated into a plurality of discrete device dies 405.

Figure 26:
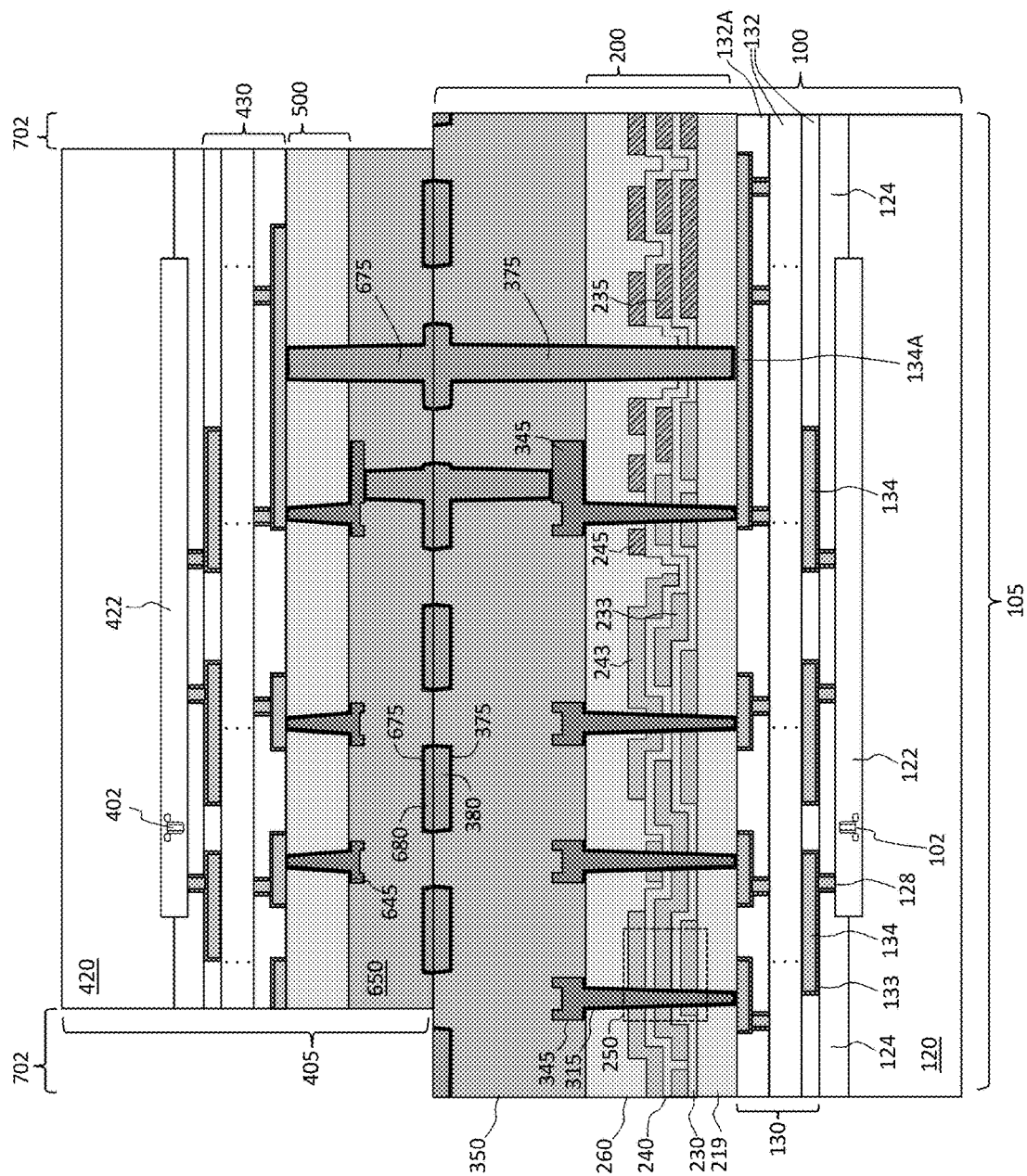

In FIG. 26 the device die 405 is bonded to the device die 105. FIG. 26 illustrates the bonding of the device die 405 to the device die 105. In the illustrated embodiment, each of the device dies 105 is still within the wafer 100. In some embodiments, each of the KGDs device dies 105 may be singulated from the wafer 100 and attached, for example, to a carrier substrate for further processing. Each of the device dies 405 bonded to the device dies 105 may have been tested and determined to be a KGD prior to bonding to the device dies 105.

While one device die 405 is illustrated as being bonded to the device dies 105, it should be appreciated that other device dies may be bonded to the device dies 105. The other device dies may be identical to the device die 405 or may be different from the device die 405. Furthermore, the device dies 405 and the other device dies may be formed using different technologies such as 45 nm technology, 28 nm technology, 20 nm technology, or the like. Also, the device dies 405 may be a digital circuit die, while the other device dies may be an analog circuit die. Device dies 105 and 405 (and other device dies, if any) in combination function as a system. Splitting the functions and circuits of a system into different dies such as device dies 105 and 405 may optimize the formation of these dies, and may result in the reduction of manufacturing cost.

The device dies 405 are placed on the wafer 100, for example by a pick and place process. The bonding of the device dies 405 to the device die 105 may be achieved through hybrid bonding. For example, the bond pads 680 are bonded to the bond pads 380 through metal-to-metal direct bonding. In accordance with some embodiments of the present disclosure, the metal-to-metal direct bonding is copper-to-copper direct bonding. The bond pads 680 may have sizes greater than, equal to, or smaller than, the sizes of the respective bond pads 380. Furthermore, the dielectric material of the second passivation structure 650 and the dielectric material of the second passivation structure 350 are bonded together in a dielectric-to-dielectric bonding, which may be fusion bonding, for example, with Si—O—Si bonds generated. Gaps 702 are left surrounding the device dies 405.

To achieve the hybrid bonding, the device dies 405 are positioned in relation to the devices dies 105 to align their respective bond pads 680 and the bond pads 380, and pressing the device dies 105 and 405 together. Then, an anneal is performed to cause the inter-diffusion of the metals in the bond pads 380 and the corresponding overlying bond pads 680. The annealing temperature may be higher than about 350° C., and may be in the range between about 350° C. and about 550° C. in accordance with some embodiments. The annealing time may be in the range between about 1.5 hours and about 3.0 hours, and may be in the range between about 1.0 hour and about 2.5 hours in accordance with some embodiments. Through the hybrid bonding, the bond pads 680 are bonded to the corresponding bond pads 380 through direct metal bonding caused by metal inter-diffusion. Likewise, the second passivation structure 650 is fusion bonded to the corresponding second passivation structure 350. Areas where the bond pads 380/680 of one device die 105/405 are in contact with the second passivation structure 650/350 of the opposing device die 405/105 are not bonded.

Without the dummy metal plates 225, 235, and 245, the upper surfaces of the second passivation structure 350 and/or the second passivation structure 650 may not be flat enough to achieve a good bond. In other words, gaps may appear between the bond pads 380/680, causing a device failure or weak bond which may lead to premature device failure. Similarly, gaps may also appear between the second passivation structures 350/650, leading to a weakened die-to-die bond which may eventually fail due to warpage or other factors. These gaps may occur due to the small differences which would exist without the dummy metal plates 225, 235, and 245. These differences would propagate to the upper surface because the planarization processes used, such as CMP processes, may not be effective to eliminate them. The dummy metal plates 225, 235, and 245, however, provide vertical padding which leads to a more effective planarization process and flatter upper surface of the device die 105 (and/or the device die 405).

Figure 27:
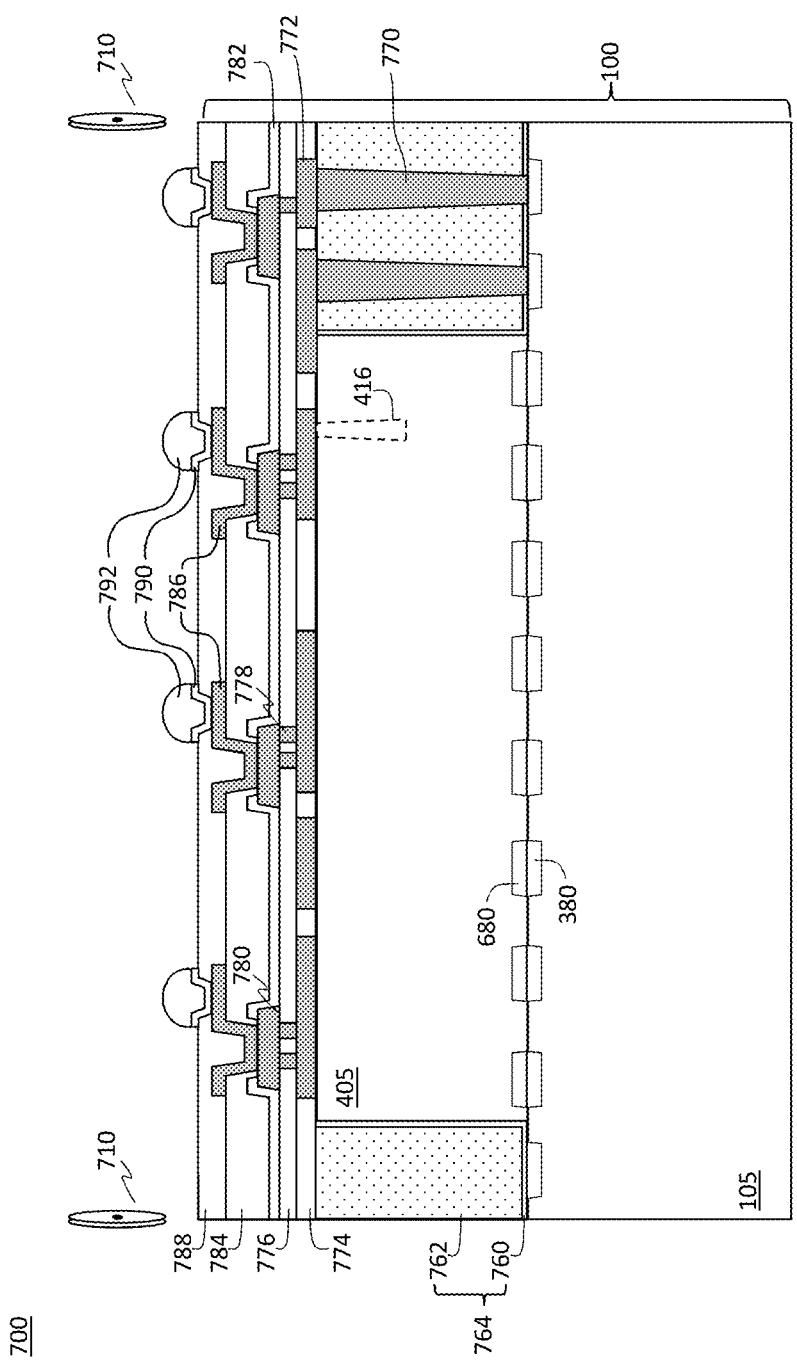

FIG. 27 illustrates the formation of a gap fill 764, the redistribution layers 772, and contact structure including the electrical connectors 792 formed over the bonded device die 105 and the device die 405, in accordance with some embodiments. The views of the device die 105 and the device die 405 have been simplified.

The gap fill 764 may include an underlying etch stop layer 760 and a dielectric fill layer 762. The etch stop layer 760 is formed of a dielectric material that has a good adhesion to the sidewalls of the device dies 405 and the top surfaces of the device die 105. In accordance with some embodiments of the present disclosure, etch stop layer 760 is formed of a nitride-containing material such as silicon nitride. Etch stop layer 760 may be a conformal layer, for example, with the thickness of horizontal portions and thickness of the vertical portions being substantially equal to each other, for example, with the difference having an absolute value smaller than about 20 percent, or smaller than about 10 percent, of both thicknesses. The deposition may include a conformal deposition method such as Atomic Layer Deposition (ALD) or Chemical Vapor Deposition (CVD).

The dielectric fill layer 762 is formed of a material different from the material of etch stop layer 760. In accordance with some embodiments of the present disclosure, dielectric fill layer 762 is formed of silicon oxide, which may be a TEOS formed silicon oxide, while other dielectric materials such as silicon carbide, silicon oxynitride, silicon oxy-carbo-nitride, PSG, BSG, BPSG, or the like may also be used. Dielectric layer 162 may be formed using CVD, High-Density Plasma Chemical Vapor Deposition (HDPCVD), Flowable CVD, spin-on coating, or the like. The dielectric layer 762 fully fills the remaining gaps 702 (FIG. 26). The dielectric fill layer 762 may cover over the top surface of the device die 405.

Following the formation of the dielectric fill layer 762, a planarization process such as a CMP process or a mechanical grinding process may be utilized to remove excess portions of the gap fill 764, so that the device dies 405 are exposed. Also, the TSVs 416 (see also, FIG. 25) are exposed.

Next, openings may be formed in the gap fill 764 for forming optional through-vias through the gap fill 764. In accordance with some embodiments, a photo resist (not shown) is formed and patterned, and the gap fill 764 is etched using the patterned photo resist as an etching mask. Openings are formed and extend down to the etch stop layer 760, which acts as the etch stop layer. The etching may be performed using any suitable process, such as through dry etching using a mixture of $NF_3$ and $NH_3$ or a mixture of HF and $NH_3$. Next, the etch stop layer 760 is etched, so that the openings extend down to the bond pads 380 of the device die 105. The etching may be performed using any suitable process, such as through dry etching using a mixture of $CF_4$, $O_2$, and $N_2$; a mixture of $NF_3$ and $O_2$; $SF_6$; or a mixture of $SF_6$ and $O_2$.

The through-vias 770 are formed in the openings and are connected to the bond pads 380. In accordance with some embodiments of the present disclosure, the formation of through-vias 770 includes performing a plating process such as an electrical-chemical plating process or an electro-less plating process. Through-vias 770 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form the through-vias 770. Through-vias 770 may have substantially straight and vertical sidewalls. Also, through-vias 770 may have a tapered profile, with top widths slightly greater than the respective bottom widths.

In some embodiments, the through-vias 770 may be formed through a portion of the device dies 405 using similar processes and materials as the through-vias 770. For example, either before or after the formation of openings for the through-vias 770, the device dies 405 may be etched to form additional openings (e.g., occupied by the illustrated TSVs 416). The additional openings in the device dies 405 and the openings for the through-vias 770 may be filled simultaneously to form the TSVs 416 and the through-vias 770. The resulting TSVs 416 may have upper portions wider than the respective lower portions, opposite to what are shown in FIG. 27.

The redistribution lines (RDLs) 772 and dielectric layer 774 are formed of a redistribution structure. In accordance with some embodiments of the present disclosure, dielectric layer 774 is formed of an oxide such as silicon oxide, a nitride such as silicon nitride, or the like. The RDLs 772 may be formed using a damascene process, which includes etching dielectric layer 774 to form openings, depositing a conductive barrier layer into the openings, plating a metallic material such as copper or a copper alloy, and performing a planarization to remove the excess portions of the metallic material.

FIG. 27 also illustrates the formation of passivation layers, metal pads, and overlying dielectric layers. Passivation layer 776 is formed over dielectric layer 774, and vias 778 are formed in passivation layer 776 to electrically connect to the RDLs 772. The metal pads 780 are formed over passivation layer 776, and are electrically coupled to the RDLs 772 and the through vias 778. Metal pads 780 may be aluminum pads or aluminum-copper pads, and other metallic materials may be used.

As also shown in FIG. 27, passivation layer 782 is formed over passivation layer 776. Each of passivation layers 776 and 782 may be a single layer or a composite layer, and may be formed of a non-porous material. In accordance with some embodiments of the present disclosure, one or both of passivation layers 776 and 782 is a composite layer including a silicon oxide layer (not shown separately), and a silicon nitride layer (not shown separately) over the silicon oxide layer. Passivation layers 776 and 782 may also be formed of other non-porous dielectric materials such as Un-doped Silicate Glass (USG), silicon oxynitride, and/or the like.

Next, passivation layer 782 is patterned, so that some portions of passivation layer 782 cover the edge portions of metal pads 780, and some portions of metal pads 780 are exposed through the openings in passivation layer 782. Polymer layer 784 is then formed, and then patterned to expose metal pads 780. Polymer layer 784 may be formed of polyimide, polybenzoxazole (PBO), or the like.

Next, Post-Passivation Interconnects (PPI) 786 are formed, which may include forming a metal seed layer and a patterned mask layer (not shown) over the metal seed layer, and plating the PPIs 786 in the patterned mask layer. The patterned mask layer and the portions of the metal seed layer overlapped by the patterned mask layer are then removed in etching processes. Polymer layer 788 is then formed, which may be formed of PBO, polyimide, or the like.

Next, Under-Bump Metallurgies (UBMs) 790 are formed, and the UBMs 790 extend into polymer layer 788 to connect to the PPIs 786. Each of the UBMs 790 may include a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs 790. A formation process for forming the UBMs 790 and the electrical connectors 792 includes depositing a blanket UBM layer, forming and patterning a mask (which may be a photo resist, not shown), with portions of the blanket UBM layer being exposed through the opening in the mask. The exposed portions may then be removed by an etching process. Then the mask may be removed to reveal the UBMs 790.

After the formation of the UBMs 790, the electrical connectors 792 are formed. The package may be placed into a plating solution (not shown), and a plating step may be performed to form the electrical connectors 792 on the UBMs 790. In accordance with some embodiments of the present disclosure, the electrical connectors 792 may include non-solder parts (not shown), which are not molten in the subsequent reflow processes. The non-solder parts may be formed of copper, and hence are referred to as copper bumps hereinafter, although they may be formed of other non-solder materials. Each of the electrical connectors 792 may also include cap layer(s) selected from a nickel layer, a nickel alloy, a palladium layer, a gold layer, a silver layer, or multi-layers thereof. The cap layer(s) are formed over the copper bumps. The cap layers of the electrical connectors 792 may include solder, which may be formed of a Sn—Ag alloy, a Sn—Cu alloy, a Sn—Ag—Cu alloy, or the like, and may be lead-free or lead-containing.

FIG. 27 also illustrates a singulation process, for example, using a die saw 710, though another suitable process may be used. The resulting structure is a package device 700.

Embodiments advantageously incorporate dummy metal plates to pad an integrated SHDMIM capacitor device layer so that the device layer has a more consistent vertical footprint (i.e., thickness). The dummy metal plates provide padding which propagates up to a bonding layer that is used in a hybrid bond. The bonding layer is therefore flatter than it would be without the dummy metal plates. As a result, voids in the bonding interface can be reduced or eliminated. Embodiments also provide a keep out zone around conductive plugs and vias which traverse the integrated device layers, but which do not connect to any of the integrated SHDMIM capacitors. The keep out zone ensures that the dummy metal plates electrically float and do not inadvertently change the device layer characteristics of the integrated SHDMIM capacitors.

One embodiment is a method including depositing a first insulating layer over a semiconductor substrate. The method also includes depositing a series of conductive layers separated by a series of dielectric layers over the first insulating layer, the series of conductive layers including device electrodes and dummy metal plates. The method also includes depositing a second insulating layer over the series of conductive layers and dielectric layers. The method also includes forming a first set of contact plugs through the series of conductive layers, each of the first set of contact plugs contacting one or more conductive layers of a first portion of the series of conductive layers. The method also includes forming a second set of contact plugs through the series of dielectric layers, each of the second set of contact plugs avoiding contact of a second portion of the series of conductive layers, the second portion of the series of conductive layers electrically floating.

In an embodiment, a density of the dummy metal plates is between 70% and 99.5%. In an embodiment, forming the second set of contact plugs further may include: etching a contact opening through the second insulating layer to expose a first dielectric layer of the series of dielectric layers; extending the contact opening successively etching through the series of dielectric layers; extending the contact opening by etching through the first insulating layer to expose a contact element of an interconnect; and depositing a conductive fill material over and filling the contact opening. In an embodiment, the method may include: depositing a passivation structure over the first set of contact plugs and over the second set of contact plugs; and forming a first set of bond pad vias through the passivation structure. In an embodiment, the first set of bond pad vias extend through the passivation structure and are electrically coupled to the contact plugs. In an embodiment, forming the first set of bond pad vias may include: forming a contact opening through the passivation structure to expose a conductive landing; and depositing a conductive fill material in the contact opening, the conductive fill material physically coupled to the conductive landing. In an embodiment, forming the first set of bond pad vias further may include: forming a contact opening in the passivation structure to expose the second insulating layer; extending the opening through the second insulating layer; extending the opening through the series of dielectric layers; extending the opening through the first insulating layer, the contact opening exposing a conductive element of an interconnect; and depositing a conductive fill material over and filling the contact opening, the conductive fill material electrically coupled to the conductive element of the interconnect.

One embodiment is a package including a first die, where the first die may include an integrated device structure disposed over an interconnect structure. The integrated device structure may include: first capacitor electrodes, the first capacitor electrodes formed at a first level of the integrated device structure; second capacitor electrodes, the second capacitor electrodes formed at a second level of the integrated device structure; a first capacitor insulator layer interposed between the first capacitor electrodes and the second capacitor electrodes; and first dummy metal plates and second dummy metal plates, the first dummy metal plates formed at the first level of the integrated device structure, the second dummy metal plates formed at the second level of the integrated device structure, where the first and second dummy metal plates electrically float from the first capacitor electrodes and second capacitor electrodes. The package also includes a second die, connectors of the second die contacting connectors of the first die.

In an embodiment, the first dummy metal plates are disposed in a first pattern, the second dummy metal plates are disposed in a second pattern, and the first pattern is different than the second pattern. In an embodiment, the package may include: a first connector electrically coupled to a first metal plate of the first capacitor electrodes; and a second connector passing through a second metal plate of the first dummy metal plates and electrically free from second metal plate. In an embodiment, the keep out zone is free of any of the first capacitor electrodes, the second capacitor electrodes, the first dummy metal plates, and the second dummy metal plates. In an embodiment, the package may include: a passivation structure formed over the integrated device structure; and bond pads disposed at an upper surface of the passivation structure. In an embodiment, the second connector physically couples a bond pad to the interconnect structure. In an embodiment, the package may include a third connector, the third connector physically coupling a bond pad to a landing of the second connector, the landing of the second connector disposed over the integrated device structure. In an embodiment, the second metal plate is disposed adjacent to at least 2 sides of the second connector.

Another embodiment is a device, including an embedded device. The device also includes an interconnect structure disposed over the embedded device. The device also includes a first passivation structure disposed over the interconnect structure. The first passivation structure may include an integrated device layer; the integrated device layer may include a first capacitor and a first dummy metal plate. The device also includes a second passivation structure disposed over the first passivation structure, the second passivation structure having bond pads disposed at an upper surface thereof. The device also includes a first connector coupled to the interconnect structure and to the first capacitor. The device also includes a second connector coupled to the interconnect structure, the second connector passing through the integrated device layer and away from the first capacitor and the first dummy metal plate.

In an embodiment, the first dummy metal plate electrically floats from the first capacitor. In an embodiment, the second connector is physically coupled to a first bond pad of the bond pads and to the interconnect structure. In an embodiment, the device may include a third connector, the third connector physically coupled to a first bond pad of the bond pads and the second connector. In an embodiment, the second connector is surrounded on three sides by the first dummy metal plate.

Another embodiment is a structure including a first insulating layer disposed over a semiconductor substrate. The structure also includes a series of conductive layers separated by a series of dielectric layers disposed over the first insulating layer, the series of conductive layers including a first level and a second level, the first level including first capacitor electrodes and first dummy metal plates, the second level including second capacitor electrodes and second dummy metal plates, the first dummy metal plates interspersed among the first capacitor electrodes. The structure also includes a second insulating layer disposed over the series of conductive layers and dielectric layers. The structure also includes a first set of contact plugs extending through the series of conductive layers and the series of dielectric layers, each of the first set of contact plugs contacting first electrodes or second electrodes of the series of conductive layers. The structure also includes a second set of contact plugs extending through the second insulating layer, the series of conductive layers, the series of dielectric layers, and the first insulating layer, a keep out zone surrounding each contact plug of the second set of contact plugs, the keep out zone free from the first capacitor electrodes, the second electrodes, the first dummy metal plates, and the second dummy metal plates.

In an embodiment, a density of the first dummy metal plates in the first level of the series of conductive layers is between 70% and 99.5%. In an embodiment, the keep out zone has a circular or rectangular shape in top down view. In an embodiment, a first plate of the first dummy metal plates extends at least partially around the keep out zone in top down view. In an embodiment, the first dummy metal plates have the same dimensions in top down view. In an embodiment, the structure further includes: a passivation structure disposed over the first set of contact plugs and over the second set of contact plugs, and a first set of bond pad vias extending through the passivation structure and electrically coupled to a first plug of the first set of contact plugs or the second set of contact plugs. In an embodiment, the conductive landing continuously extends to the landing contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first die, the first die comprising an integrated device structure disposed over an interconnect structure, the integrated device structure comprising:
   first capacitor electrodes, the first capacitor electrodes formed at a first level of the integrated device structure;
   second capacitor electrodes, the second capacitor electrodes formed at a second level of the integrated device structure;
   a first capacitor insulator layer interposed between the first capacitor electrodes and the second capacitor electrodes; and
   first dummy metal plates and second dummy metal plates, the first dummy metal plates formed at the first level of the integrated device structure, the second dummy metal plates formed at the second level of the integrated device structure, wherein the first and second dummy metal plates electrically float from the first capacitor electrodes and second capacitor electrodes; and
   a second die, connectors of the second die contacting connectors of the first die.

2. The package of claim 1, wherein the first dummy metal plates are disposed in a first pattern, wherein the second dummy metal plates are disposed in a second pattern, and the first pattern is different than the second pattern.

3. The package of claim 1, further comprising:
   a first connector electrically coupled to a first metal plate of the first capacitor electrodes; and
   a second connector passing through a second metal plate of the first dummy metal plates and electrically free from the second metal plate.

4. The package of claim 3, further comprising a keep out zone disposed around the second connector, wherein the keep out zone is free of any of the first capacitor electrodes, the second capacitor electrodes, the first dummy metal plates, and the second dummy metal plates.

5. The package of claim 3, further comprising:
   a passivation structure formed over the integrated device structure; and
   bond pads disposed at an upper surface of the passivation structure.

6. The package of claim 5, wherein the second connector physically couples a bond pad to the interconnect structure.

7. The package of claim 5, further comprising a third connector, the third connector physically coupling a bond pad to a landing of the second connector, the landing of the second connector disposed over the integrated device structure.

8. The package of claim 3, wherein the second metal plate is disposed adjacent to at least two sides of the second connector.

9. A device comprising:
   an embedded device;
   an interconnect structure disposed over the embedded device;
   a first passivation structure disposed over the interconnect structure, the first passivation structure comprising
     an integrated device layer, the integrated device layer comprising a first capacitor plate and a first dummy metal plate, the first capacitor plate having a bottommost surface and a topmost surface, the first dummy metal plate having a bottommost surface that is level with the bottommost surface of the first capacitor plate and having a topmost surface that is level with the topmost surface of the first capacitor plate, and
     a second integrated device layer, the second integrated device layer comprising a second capacitor plate and a second dummy metal plate, the second capacitor plate having a bottommost surface that is above the topmost surface of the first capacitor plate and having a topmost surface, the second dummy metal plate having a bottommost surface that is level with the bottommost surface of the second capacitor plate and having a topmost surface that is level with the topmost surface of the second capacitor plate;
   a second passivation structure disposed over the first passivation structure, the second passivation structure having bond pads disposed at an upper surface thereof;
   a first connector coupled to the interconnect structure and to the first capacitor; and
   a second connector coupled to the interconnect structure, the second connector passing through the first and second integrated device layers and located away from the first capacitor and the first dummy metal plate.

10. The device of claim 9, wherein the first dummy metal plate electrically floats from the first capacitor.

11. The device of claim 9, wherein the second connector is physically coupled to a first bond pad of the bond pads and to the interconnect structure.

12. The device of claim 9, further comprising a third connector, the third connector physically coupled to a first bond pad of the bond pads and the second connector.

13. The device of claim 9, wherein the second connector is surrounded on at least three sides by the first dummy metal plate.

14. A structure comprising:
first insulating layer disposed over a semiconductor substrate;
a series of conductive layers separated by a series of dielectric layers disposed over the first insulating layer, the series of conductive layers including a first level and a second level, the first level including first capacitor electrodes and first dummy metal plates, the second level including second capacitor electrodes and second dummy metal plates, the first dummy metal plates interspersed among the first capacitor electrodes;
a second insulating layer disposed over the series of conductive layers and dielectric layers;
a first set of contact plugs extending through the series of conductive layers and the series of dielectric layers, each of the first set of contact plugs contacting first electrodes or second electrodes of the series of conductive layers; and
a second set of contact plugs extending through the second insulating layer, the series of conductive layers, the series of dielectric layers, and the first insulating layer, a keep out zone surrounding each contact plug of the second set of contact plugs, the keep out zone free from the first capacitor electrodes, the second electrodes, the first dummy metal plates, and the second dummy metal plates.

15. The structure of claim 14, wherein a density of the first dummy metal plates in the first level of the series of conductive layers is between 70% and 99.5%.

16. The structure of claim 14, wherein the keep out zone has a circular or rectangular shape in top down view.

17. The structure of claim 14, wherein a first plate of the first dummy metal plates extends at least partially around the keep out zone in top down view.

18. The structure of claim 14, wherein the first dummy metal plates have the same dimensions in top down view.

19. The structure of claim 14, further comprising:
a passivation structure disposed over the first set of contact plugs and over the second set of contact plugs; and
a first set of bond pad vias extending through the passivation structure and electrically coupled to a first plug of the first set of contact plugs or the second set of contact plugs.

20. The structure of claim 14, further comprising:
a conductive landing extending horizontally along an upper surface of the second insulating layer, the conductive landing coupled to a landing contact plug, the landing contact plug corresponding to the first set of contact plugs or the second set of contact plugs, wherein the conductive landing continuously extends to the landing contact plug.

* * * * *